United States Patent [19]

Cideciyan et al.

[11] Patent Number: 5,241,309
[45] Date of Patent: Aug. 31, 1993

[54] DATA CODING FOR FAST START-UP OF PRML RECEIVERS

[75] Inventors: Roy D. Cideciyan, Thalwil; Francois B. Dolivo, Wadenswil, both of Switzerland

[73] Assignee: International Business Machines Corporation, Armonk, N.Y.

[21] Appl. No.: 565,542

[22] Filed: Aug. 10, 1990

[30] Foreign Application Priority Data

Aug. 16, 1989 [EP] European Pat. Off. ............ 89810607

[51] Int. Cl.⁵ ...................... H03M 5/14; H03M 7/00; H03M 7/46
[52] U.S. Cl. ........................ 341/59; 341/95; 341/102
[58] Field of Search ............ 341/59, 95, 50, 102; 375/18

[56] References Cited

U.S. PATENT DOCUMENTS

| | | | |
|---|---|---|---|
| 4,617,552 | 10/1986 | Kojima et al. | 340/347 |
| 4,644,564 | 2/1987 | Dolivo et al. | 375/18 |
| 4,707,681 | 11/1987 | Eggenberger et al. | 341/59 |
| 4,786,890 | 11/1988 | Marcus et al. | 341/81 |
| 4,870,414 | 9/1989 | Karabed et al. | 341/57 |
| 4,890,299 | 12/1989 | Dolivo et al. | 341/50 X |
| 5,001,482 | 3/1991 | Chung et al. | 341/136 |
| 5,040,191 | 8/1991 | Forney, Jr. et al. | 375/39 |

FOREIGN PATENT DOCUMENTS

| | | |
|---|---|---|
| 0177950 | 4/1986 | European Pat. Off. . |
| 0243708 | 11/1987 | European Pat. Off. . |
| 0301191 | 2/1989 | European Pat. Off. . |
| 0319101 | 6/1989 | European Pat. Off. . |
| 2551277 | 3/1985 | France . |

OTHER PUBLICATIONS

IBM Technical Disclosure Bulletin, Jan. 31, 1989, No. 8, Armonk, NY, "Rate 16/17 (0,6/6) Code", pp. 21–23.
IBM Technical Disclosure Bulletin, vol. 28, No. 3, Aug. 1985, pp. 1048–1051. "Run Length Restriction On The Output of PR4 Channels".

*Primary Examiner*—Sharon D. Logan
*Attorney, Agent, or Firm*—Roy W. Truelson; Richard E. Billion

[57] ABSTRACT

In recording systems using partial-response maximum-likelihood detection (PRML) techniques, data sequences are preceded by a preamble consisting of all ones. Coding schemes are disclosed which allow to keep the number of consecutive ones occurring in the coded data sequences at a minimum, while simultaneously restricting the number of consecutive zeros in full and partial data sequences to a low value which is important for improving receiver operation. The disclosed coding schemes and apparatus enable a faster and more reliable discrimination between timing preambles and data sequences, thus allowing to use shorter timing preambles which results in faster receiver start-up and in a reduction of storage overhead for the preambles.

13 Claims, 6 Drawing Sheets

(4,6,4) ENCODER $$D(4,6,5) \equiv \begin{bmatrix} \text{matrix of digits and dashes} \end{bmatrix}$$

FIG. 3C

$$L_1(4,4,9) \equiv \begin{bmatrix} \text{matrix of dots and squares} \end{bmatrix}$$

$D(4,6,4) \equiv$ (4,6,4) ENCODER (4,6,4) DECODER

DATA CODING FOR FAST START-UP OF PRML RECEIVERS

FIELD OF INVENTION

The present invention is concerned with data coding for systems using partial-response signaling with maximum-likelihood sequence detection (PRML). Such a signaling and detection scheme is useful e.g. for magnetic or optic storage of data, and for data transmission over cables. In particular, the invention is concerned with data coding in PRML systems to shorten the time needed for recognizing timing preambles that precede the data sequences to ensure proper timing and gain acquisition in the receiver, and to achieve a more reliable distinction between arbitrary data sequences and the timing preamble.

BACKGROUND

Rate 8/9 constrained codes for partial-response class-IV signaling with maximum-likelihood sequence detection (PRML) have been designed to achieve proper operation of gain and timing control loops and reduction of path-memory length of Viterbi detectors in PRML receivers. In the presence of a precoder between partial-response class-IV (PR-IV) channel and rate 8/9 encoder, these two objectives are met by restricting the maximum run-length of 0's, denoted by $G_0$, in encoded binary sequences $\{b_n\}$ and limiting the maximum number of consecutive 0's, denoted by $I_0$, in the two subsequences of $\{b_n\}$ with even or odd time indices. An example of a system where $G_0$ and $I_0$ are both limited by appropriate coding (either to 4 and 4, or to 3 and 6, respectively) is disclosed in U.S. Pat. No. 4,707,681 to Eggenberger.

It would be desirable to have coding schemes which can accomplish a third task, i.e. to speed up the start-up procedure of PRML receivers by shortening the minimum observation length required to distinguish reliably encoded user data from the timing preamble $\{1,1,1,\ldots,1,1\}$, which in many systems is part of training sequences preceding encoded data sequences $\{b_n\}$.

OBJECTS OF THE INVENTION

It is an object of the invention to devise a coding scheme for PRML systems by which the time required for distinguishing timing preambles from coded data sequences is reduced.

It is another object to provide a coding scheme allowing to use shorter timing preambles.

A further object of the invention is a PRML coding scheme allowing the selection of code mappings which enable simple implementation of encoders and decoders by logic gate arrays.

Another object of the invention is to provide a coding scheme for systems using the PRML technique and using a timing preamble of consecutive ones which allows to maintain code constraints that are useful for the proper operation of gain and timing control loops and for limiting the path memory-length of Viterbi decoders in the receiver.

SUMMARY OF THE INVENTION

These objects are achieved by an encoding method and by encoding apparatus as defined in claims 1 and 7. Preferred particular embodiments of this method and of encoding and decoding apparatus are defined in the dependent claims.

The invention attains the objects by limiting the number $G_1$ of consecutive ones in the encoded data sequence to a relatively low value, while maintaining the limitation in the numbers of consecutive zeros in the full encoded sequence as well as in the even and odd numbered partial sequences. The smaller the maximum run-length of 1's, denoted $G_1$, in encoded sequences $\{b_n\}$, the faster data can be discriminated from the preamble. Since the timing preamble has to be long enough to be reliably detected by PRML receivers during start-up, smaller values of $G_1$ allow shorter training sequences leading to faster synchronization of PRML receivers. The presented 8/9 codes, referred to by the 3-tuple ($G_0$, $I_0$, $G_1$), permit reliable, fast start-up of PRML receivers and the length of the preamble detection window needs typically to be less than one half of the window required with earlier codes presented in U.S. Pat. No. 4,707,681.

Several coding schemes are disclosed which allow to select different combinations of code constraints so that a combination can be chosen which best suits the respective application. These schemes have furthermore the property that decoding can be achieved without knowledge of previously encoded data, thereby avoiding decoding error propagation in case of transmission errors.

Further disclosed are several code mapping schemes which allow to implement the encoders (and decoders) for the presented coding schemes with a small number of logic gates.

These and other advantages will become more apparent from the following description of preferred embodiments of the invention with reference to the drawings.

BRIEF DESCRIPTION OF THE DRAWINGS

FIGS. 3A, 3B and 3C show for one specific code a pattern, in the matrix of all 9-bit words, which indicates the preselection of all potential codewords; the partitioning of the matrix of all possible 8-bit input words into nine subsets, to facilitate assignment between coder input and output words; and the assignment between input and output subsets;

FIG. 4 shows for another code the pattern, in the matrix of all 9-bit words, which indicates the preselection of all potential codewords;

FIGS. 5A, 5B and 5C show similar selections and assignments as in FIGS. 3A, 3B and 3C, for a further code;

Tables 1 through 6 show the encoder logic and the decoder logic for three different implementations of the invention.

DETAILED DESCRIPTION OF THE PREFERRED EMBODIMENT

Data Format with Preambles

Figure 1:
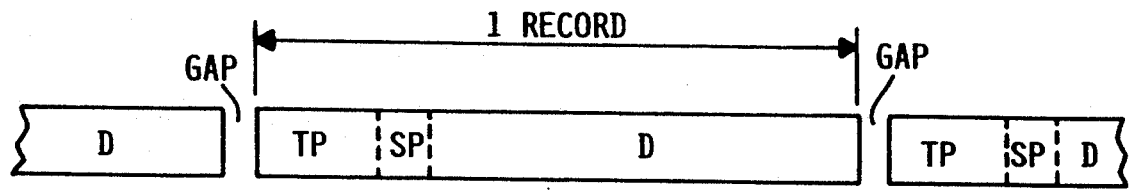
FIG. 1 is a schematic representation of the structure of stored data sequences which comprise a timing preamble.

FIG. 1 shows an example of the structure of a data sequence when stored in a magnetic recording medium (magnetic disk). As can be seen, each data record is stored separately. The data section of each record is preceded by a timing preamble and a synchronizing pattern; these are necessary for initiating the receiver to properly read the recorded data.

It is important that the timing preamble is correctly distinguished from the data. If the data can comprise any arbitrary bit patterns, including such which resemble the used timing preamble (i.e. {1, 1, 1, ... }), relatively long timing preambles must be used and relatively much time is required for reliable detection and discrimination.

To shorten this time, the present invention suggests to add a constraint to the coded data sequences such that bit patterns corresponding to such a timing preamble will only occur in limited length. This allows a faster distinction between the data and the preamble, and as a consequence allows to use shorter timing preambles (which require less storage space).

Basic Model

Figure 2A:
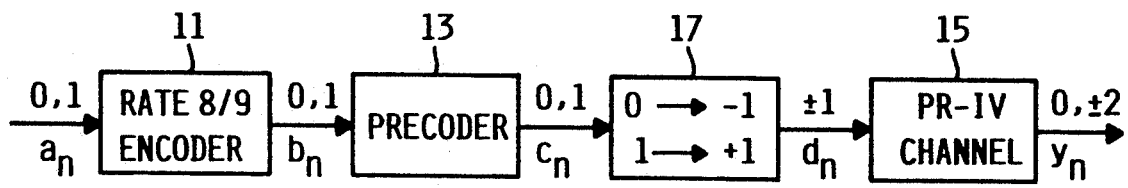
FIG. 2A is a block diagram representation of a system in which present invention finds application.

A system in which present invention is used can be represented by the following three main blocks depicted in FIG. 2A: rate 8/9 encoder 11, precoder 13, and PR-IV channel 15. In the following, input-output relationship of these blocks are discussed in detail. B denotes the binary alphabet {0,1}.

Magnetic-recording channels are baseband channels with a transfer characteristic exhibiting a spectral null at frequency $f=0$, a spectral maximum at a frequency that depends on the particular recording-system parameters and an exponential decay at higher frequencies. Therefore, they are particularly well suited to be treated as a PR-IV system after the channel-output signal is filtered in an appropriate manner. The PR-IV channel 15 is preceded by a precoder 13 whose input sequence is the encoded sequence $\{b_n\}$, $b_n \epsilon B$, and whose output sequence $\{c_n\}$, $c_n \epsilon B$, is given by $$c_n = b_n \oplus c_{n-2} = \begin{cases} c_{n-2}, \text{ if } b_n = 0 \\ \overline{c_{n-2}}, \text{ if } b_n = 1 \end{cases} \quad (1)$$

where $\oplus$ denotes mod 2 addition and overbar stands for negation. The input symbols of the PR-IV channel $d_n \epsilon \{+1, -1\}$ and the precoder-output symbols $c_n$ are related to each other (as shown by block 17) by the correspondence $d_n = 2c_n - 1$, where $c_n$ have to be interpreted as the real numbers 0 or 1. The ternary output sequence of the PR-IV channel $\{y_n\}$ can then be written as $$y_n = d_n - d_{n-2} = 2(c_n - c_{n-2}) = \begin{cases} 0, \text{ if } b_n = 0 \\ \pm 2, \text{ if } b_n = 1 \end{cases} \quad (2)$$

where (1) was used to obtain the relationship between $b_n$ and $y_n$. Note that the all-zero sequence and the timing preamble (the all-one sequence) at the input of the precoder result in the all-zero sequence and { ..., +2, +2, −2, −2, +2, +2, −2, −2, ... }, respectively, at the output of the PR-IV channel.

The run-length of 0's in the output sequence $\{y_n\}$ of the PR-IV channel and in its two subsequences with even or odd time indices have to be limited in order to aid the automatic gain control and timing recovery, and reduce the length of path memory in the Viterbi detector. This can be achieved by a method and apparatus as disclosed in U.S. Pat. No. 4,707,681 to Eggenberger. The maximum run-length of channel outputs $y_n$ identical to the timing preamble at the output of the PR-IV channel { ..., +2, +2, −2, −2, ... } must also be reduced to permit reliable, fast start-up of PRML receivers. These goals can be achieved efficiently by present invention using a rate 8/9 encoder 11 followed by a precoder 13 that translates the desired run-length constraints originally defined at the output of the PR-IV channel into simple run-length constraints $(G_0, I_0, G_1)$ at the output of the rate 8/9 encoder.

Precoding does not affect the performance of data communication systems employing binary PR-IV signaling and maximum-likelihood sequence-detection. However, the presence of a precoder can lead to smaller run-length constraints at the output of the PR-IV channel if encoders are restricted to a specific class. For example, in the absence of a precoder, the class of rate 8/9 block encoders with output block-size equal to 9 cannot produce channel-output sequences $\{y_n\}$ which have at most $u=4$ consecutive 0's and whose two subsequences with even or odd time indices have at most $v=4$ consecutive 0's. This can be explained as follows. There are no more than 216 binary 9-tuples which lead to PR-IV sequences $\{y_n\}$ satisfying the constraints $u=4$ and $v=4$ when they are transmitted over the PR-IV channel in any order. On the other hand, when the PR-IV channel is preceded by a precoder, there are 279 binary 9-tuples which can be juxtaposed in any order, and rate 8/9 block codes with output block-size equal to 9 that give rise to channel-output sequences constrained by $u=4$ and $v=4$ can be constructed (cf. U.S. Pat. No. 4,707,681 mentioned above).

The input of the rate 8/9 encoder $\{a_n\}$, $a_n \epsilon B$, is an unconstrained binary sequence and the encoder output $\{b_n\}$, $b_n \epsilon B$, satisfies the following Boolean equations $$\sum_{k=0}^{G_0} b_{n+k} \equiv b_n + b_{n+1} + b_{n+2} + \ldots + b_{n+G_0} = 1, \quad (3)$$

$$\sum_{k=0}^{I_0} b_{n+2k} \equiv b_n + b_{n+2} + b_{n+4} + \ldots + b_{n+2I_0} = 1, \quad (4)$$

$$b_n \cdot b_{n+1} \cdot b_{n+2} \cdot \ldots \cdot b_{n+G_1} = 0, \quad (5)$$

where n is any integer, '+' denotes the Boolean OR operation and '·' stands for the Boolean AND operation. Equation (3) limits the maximum run-length of 0's in the encoder-output sequence to $G_0$. Equation (4) does not allow the maximum number of consecutive 0's in the two encoder-output subsequences with even or odd time indices to exceed $I_0$. Finally, equation (5) ensures that the maximum run-length of 1's in the encoder-output sequence is not greater than $G_1$. In the following, the encoder output will be designated as a $(G_0, I_0, G_1)$-constrained sequence.

Encoder Input and Output

Figure 2B:
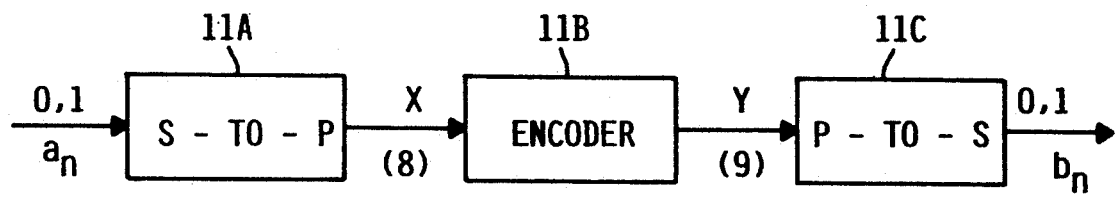
FIG. 2B is a more detailed block diagram of the encoder section of the system of FIG. 2A.

FIG. 2B shows more detail of the encoder section 11 of FIG. 2A. The encoder proper 11B which accepts 8-bit input blocks X and furnishes 9-bit output codewords Y, is preceded by a serial-to-parallel converter 11A which converts the serial stream of bits $a_n$ into the input blocks X. At the output side of the encoder, a parallel-to-serial converter 11C converts the codewords Y into a serial bit stream of bits $b_n$.

Encoders And Decoders For Selected Block Codes

The encoder for an (n,k) block code with rate equal to k/n assigns to every block of k input symbols a block of n output symbols. The motivation for the use of (9,8) block codes as opposed to non-block codes is the simplicity of the encoder/decoder hardware associated with block codes. The nonlinear binary (9,8) block codes designed so far were constructed with the objective of minimizing the constraints $G_0$ and $I_0$ (cf. e.g. U.S. Pat. No. 4,707,681). In the following, simple encoder/decoder realizations of two optimum (9,8) block codes which minimize the parameter $G_1$ in addition to $G_0$ and $I_0$ are presented. In terms of the 3-tuple ($G_0$, $I_0$, $G_1$), these codes are characterized by (4,6,5) and (4,4,9). The smallest sum of constraints $G_0+I_0+G_1$ achievable with a (9,8) block code is 15. This minimum is only attained by (4,6,5) and (4,5,6) among all constraints ($G_0$, $I_0$, $G_1$).

Encoder/Decoder For (4,6,5) Code

An encoder/decoder realization of the (4,6,5) code is described first. The encoder design starts by selecting all 9-tuples $Y=(Y_1,Y_2,\ldots,Y_9) \in B^9$ which satisfy the following Boolean equations $$(Y_1+Y_2+Y_3)\cdot(Y_2+Y_3+Y_4+Y_5+Y_6)\cdot(Y_3+Y_4+Y_5+Y_6+Y_7)\cdot$$
$$(Y_4+Y_5+Y_6+Y_7+Y_8)\cdot(Y_7+Y_8+Y_9)=1 \quad (6)$$

$$(Y_1+Y_3+Y_5+Y_7)\cdot(Y_3+Y_5+Y_7+Y_9)\cdot(Y_2+Y_4+Y_6+Y_8)=1 \quad (7)$$

and either $$Y_1\cdot Y_2\cdot Y_3 + Y_2\cdot Y_3\cdot Y_4\cdot Y_5\cdot Y_6\cdot Y_7$$
$$+ Y_3\cdot Y_4\cdot Y_5\cdot Y_6\cdot Y_7\cdot Y_8 + Y_6\cdot Y_7\cdot Y_8\cdot Y_9 = 0 \quad (8a)$$

or $$Y_1\cdot Y_2\cdot Y_3\cdot Y_4 + Y_2\cdot Y_3\cdot Y_4\cdot Y_5\cdot Y_6\cdot Y_7$$
$$+ Y_3\cdot Y_4\cdot Y_5\cdot Y_6\cdot Y_7\cdot Y_8 + Y_7\cdot Y_8\cdot Y_9 = 0 \quad (8b)$$

where (6), (7) and (8a) are used to generate a list $L_1$ of 263 codewords and (6), (7) and (8b) another list $L_2$ of 263 codewords. By discarding all 9-tuples Y which begin or end with more than two 0's or have a run of five or more 0's, equation (6) ensures that the constraint $G_0=4$ is satisfied. Equation (7) guarantees $I_0=6$ by limiting the run-length of 0's within $Y_1Y_3Y_5Y_7Y_9$ and $Y_2Y_4Y_6Y_8$ to three.

Finally, equation (8a) ((8b)) ensures $G_1=5$ by eliminating all Y which begin with more than two (three) 1's or end with more than three (two) 1's or have a run of six or more 1's. Note that if $Y=(Y_1, Y_2, \ldots, Y_9) \in L_1$ then $Y'=(Y_9, Y_8, \ldots, Y_1) \in L_2$. Hence the codewords in one list can be simply obtained by reversing the codewords in the other list. The (4,6,5) block code presented here comprises 256 codewords and was arbitrarily chosen to be a subset of $L_1$ as opposed to $L_2$. The 263 potential codewords in $L_1$ will be illustrated as 263 specific locations marked "■" within the 16×32 array shown in FIG. 3A, whose (i,j)-th location at the intersection of the i-th row, i=0,1, ..., 15, and the j-th column, j=0,1, ..., 32, corresponds to the 9-tuple $Y=(Y_1, Y_2, \ldots, Y_9)$ where $Y_9Y_8Y_7Y_6$ and $Y_5Y_1Y_2Y_3Y_4$ are the binary representations of the decimal numbers i and j, respectively. Note that the left half of the above array corresponds to $Y_5=0$ whereas the right half corresponds to $Y_5=1$. The locations in $L_1$ (4,6,5) marked "—" represent 9-tuples which are not allowed to be used as codewords in the (4,6,5) block code presented here.

There are numerous block codes that can be derived from the array $L_1$ (4,6,5), and the codewords in each code can be assigned to 256 8-bit bytes in 256! ways. Thus, the number of all encoder mappings associated with the array $L_1$ (4,6,5) is very large. Thus, it is desirable to choose an encoder mapping that leads to simple encoder/decoder realizations.

The space of all encoder input bytes B8 is divided into 9 pairwise disjoint sets $A_k$, k=1,2, ..., 9. The elements of the subset $A_k$ will be illustrated as specific locations marked "k" within the 16×16 array shown in FIG. 3B, whose (i,j)-th location at the intersection of the i-th row, i=0,1, ..., 15, and the j-th column, j=0,1, ..., 15, corresponds to the byte $X=(X_1, X_2, \ldots, X_8)$ where $X_8X_7X_6X_5$ and $X_1X_2X_3X_4$ are the binary representations of the decimal numbers i and j, respectively.

Similarly, the elements of $D_k$, k=1,2, ..., 9, the images of $A_k$ under the encoder mapping, are illustrated as specific locations marked "k" within the 16×32 array shown in FIG. 3C, whose (i,j)-th location at the intersection of the i-th row, i=0,1, ..., 15, and the j-th column, j=0,1, ..., 31, corresponds to the 9-tuple $Y=(Y_1, Y_2, \ldots, Y_9)$ where $Y_9Y_8Y_7Y_6$ and $Y_5Y_1Y_2Y_3Y_4$ are the binary representations of the decimal numbers i and j, respectively.

The pattern of _'s in D (4,6,5) represent all 9-tuples which cannot be used as codewords and is the same as the pattern of —'s in $L_1$ (4,6,5). The seven 9-tuples in $L_1$ which are not used as codewords in the (4,6,5) block code presented here correspond to locations marked "■" in D (4,6,5). The partitions $A_1$ and $D_1$ are as follows: the patterns of 1's in A (4,6,5) and in the right half of D (4,6,5) are the same as the pattern of ■'s in the right half of $L_1$ (4,6,5). The other subsets $A_k$, k=2,3, ..., 9, and their images under the encoder mapping $D_k$, k=2,3, ..., 9, are simultaneously chosen such that the number of logic gates needed is as small as possible. Note that the choice of partitions $A_k$ and $D_k$ and of the one-to-one correspondences between $A_k$ and $D_k$ does not follow any rules except for k=1.

The encoder and decoder logic of the (4,6,5) code is shown in Tables 1 and 2, respectively. In the sequel, the overbar used in the tables denotes negation in the Boolean algebra. Intermediate variables $V_i$, i=1,2, ..., 7, for the encoder and $W_i$, i=1,2, ..., 9, for the decoder were used to reduce the number of logic gates. For the same purpose, superpartitions $S_i$, i=1,2, ..., 9, for the encoder and $T_i$, i=1,2, ..., 6, for the decoder were introduced as the union of partitions. The decoder includes an optional error flag F which is raised (i.e., F=1) when the decoder input is an illegal codeword.

Minimum Value of Constraints Sum

In the following, $\sigma$ denotes the sum of all three constraints, i.e., $$\sigma = G_0 + I_0 + G_1. \qquad (9)$$

The block codes presented so far achieve $\sigma = 15$. To find out the smallest $\sigma$ achievable with a (9,8) block code, the maximum number of freely concatenatable 9-tuples, $n_{max}$, was determined for all relevant constraints. The smallest $\sigma$ achievable with an encoder for a (9,8) block code is only attained by (4,5,6) and (4,6,5).

Encoder/Decoder for (4,4,9) Code

An encoder/decoder realization of the (4,4,9) block code was obtained by modifying the encoder/decoder logic associated with one block code given in U.S. Pat. No. 4,707,681.

The conditions for the selection of output codewords are given by equation (6) and the following two equations:

$$(Y_1+Y_3+Y_5)\cdot(Y_5+Y_7+Y_9)\cdot(Y_2+Y_4+Y_6)\cdot(Y_4+Y_6+Y_8)=1, \qquad (10)$$

and either $$Y_1\cdot Y_2\cdot Y_3\cdot Y_4\cdot Y_5\cdot Y_6 + Y_5\cdot Y_6\cdot Y_7\cdot Y_8\cdot Y_9 = 0, \qquad (11a)$$

or $$Y_1\cdot Y_2\cdot Y_3\cdot Y_4\cdot Y_5 + Y_4\cdot Y_5\cdot Y_6\cdot Y_7\cdot Y_8\cdot Y_9 = 0, \qquad (11B)$$

where (6), (10) and (11a) are used to generate a list $L_1$ of 259 codewords and (6), (12) and (11b) another list $L_2$ of 259 codewords. Equations (6) and (10) ensure $G_0 = 4$ and $I_0 = 4$, whereas (11a) or (11b) guarantees $G_1 = 9$. Note that the codewords in $L_2$ can be simply obtained by reversing the codewords in $L_1$. The (4,4,9) block code presented here comprises 256 codewords and was arbitrarily chosen to be a subset of $L_1$.

The 259 codewords in $L_1$ will be again illustrated as locations marked "■" within a $16\times 32$ array $L_1$ (4,4,9) shown in FIG. 4.

Tables 3 and 4 show encoder and decoder logic of the (4,4,9) code including an optional error detection flag F, which is raised when the decoder input is an illegal codeword. Note that the notation associated with the encoder/decoder partitions in U.S. Pat. No. 4,707,681 has been adopted. The codeword assignments were chosen such that the logic realizations of the encoder and decoder are simple.

The two encoder/decoder realizations presented above correspond to optimum (9,8) block codes, i.e., none of the constraints $G_0$, $I_0$ and $G_1$ can be decreased further without relaxing another one.

Finite-State Encoders

The block encoders discussed in the previous section break the information sequence into blocks and handle them independently. In the following, a further encoder will be described which is a finite-state machine, i.e. in this encoder the output is not only dependent on the present input but also depends on previous encoded inputs. This encoder allows an even better reduction in run-lengths. Decoders which are used with this finite-state encoder need not to be finite-state machines but can be block decoders.

Encoder and Decoder for (4,6,4) Code

The encoder for the (4,6,4) code is a finite-state machine where the encoder state is defined as the last bit of the preceding codeword. Similar to the decoders discussed above, the decoder associated with the (4,6,4) code can be realized as a block decoder which maps every 9-bit block at its input into a block of 8 bits. The (4,6,4) code performs better than the block codes described above, i.e., it achieves $G_0 = 4$, $G_1 = 4$ and $\sigma = 14$, and yet its encoder/decoder implementation is almost as simple as the ones for block codes.

In the following, the (4,6,4) code and its encoder/decoder realization are described. A list L of 230 codewords is obtained by selecting all 9-tuples $Y = (Y_1, Y_2, \ldots, Y_9) \in B^9$ which satisfy (6), (7) and $$Y_1\cdot Y_2\cdot Y_3 + Y_2\cdot Y_3\cdot Y_4\cdot Y_5\cdot Y_6 + Y_3\cdot Y_4\cdot Y_5\cdot Y_6\cdot Y_7 + Y_4\cdot Y_5\cdot Y_6\cdot Y_7\cdot Y_8 + Y_7\cdot Y_8\cdot Y_9 = 0. \qquad (12)$$

Conditions (6) and (7) ensure $G_0 = 4$ and $I_0 = 6$, whereas (12) guarantees $G_1 = 4$. The codewords in L do not begin with more than two 0's or 1's. However, if the last bit of the preceding codeword, henceforth denoted Z, is known, the next codeword may start with three or four 0's in the case $Z = 1$ and three or four 1's in the case $Z = 0$. There are 26 binary 9-tuples which begin with three or four 0's and do not violate (7), (12) and a modified version of (6) with $(Y_1+Y_2+Y_3)$ replaced by $(Y_1+Y_2+Y_3+Y_4+Y_5)$ to allow the codewords to begin with three or at most four 0's. Similarly, there are 35 binary 9-tuples which begin with three or four 1's and do not violate (6), (7) and a modified version of (12) with $(Y_1\cdot Y_2\cdot Y_3)$ replaced by $(Y_1\cdot Y_2\cdot Y_3\cdot Y_4\cdot Y_5)$ to allow the codewords to begin with three or at most four 1's.

Figure 3A:
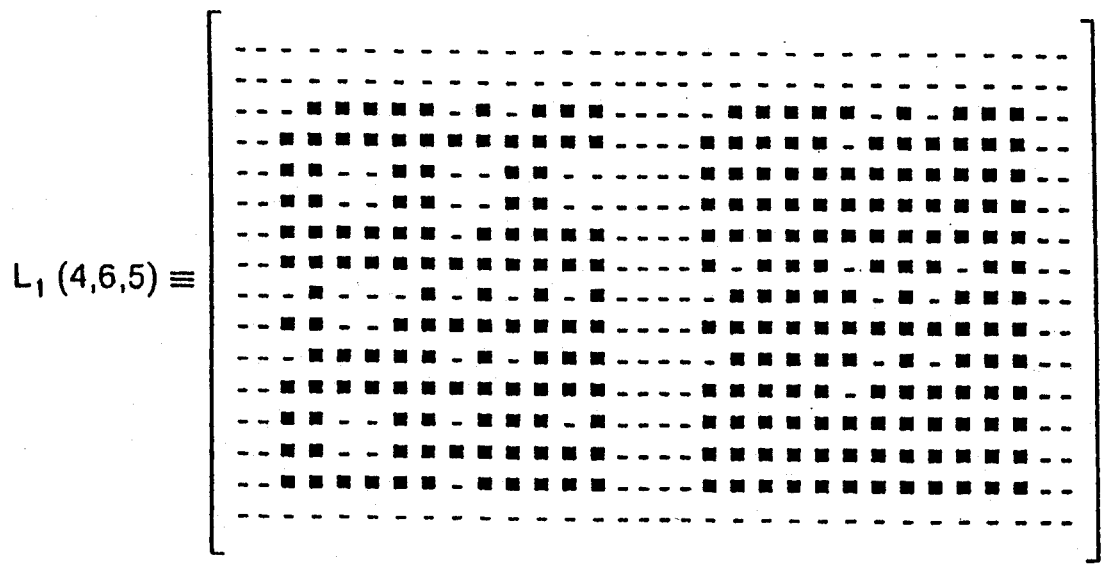
Figures 5A, 5B:
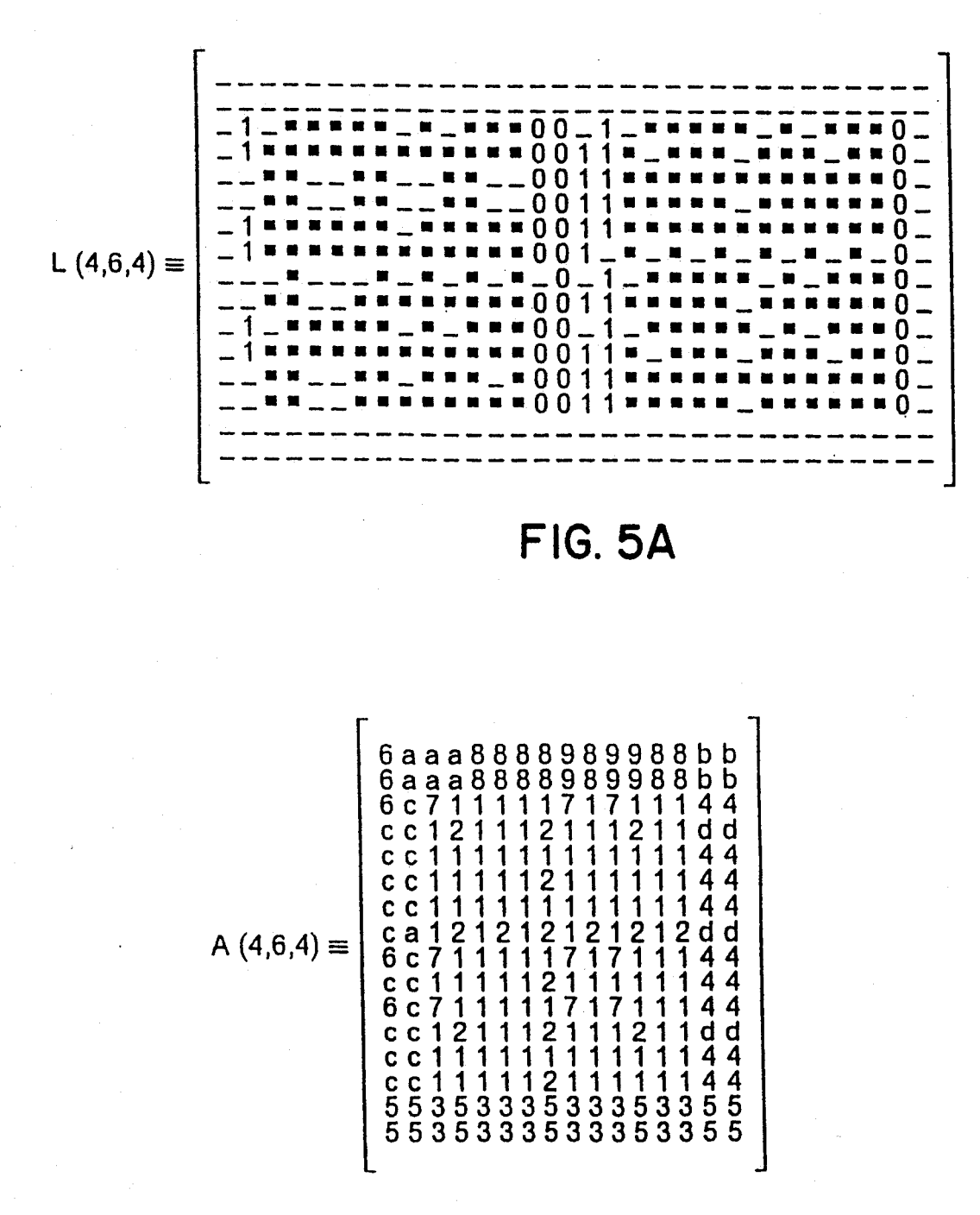

The 230 codewords in L, the 26 codewords following $Z = 1$ and the 35 binary 9-tuples following $Z = 0$ will be illustrated as specific locations marked "■", "1" and "0", respectively, within the $16\times 32$ array shown in FIG. 5A, where the definition with respect to the correspondence between an array location and a 9-tuple in FIG. 3A applies. The pattern of _'s in L (4,6,4) represents all 9-tuples which cannot be used as codewords. The space of 256 input bytes B8 is divided into 13 pairwise disjoint sets $A_k$, $k = 1,2,\ldots,9$, a, b, c, d, where the subscript k is a hexadecimal number.

Figure 3B:
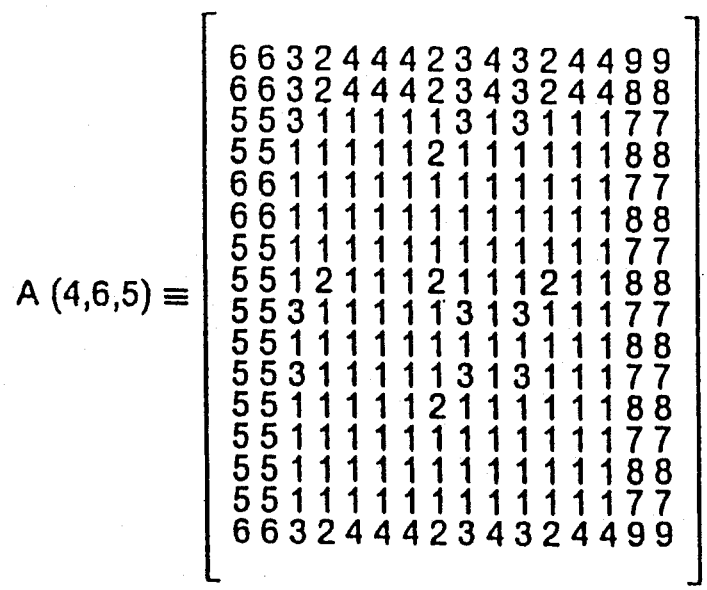

The elements of the subsets $A_k$, $k = 1,2,\ldots,d$, will be illustrated as specific locations marked "k" within the $16\times 16$ array shown in FIG. 5B where the definition with respect to the correspondence between an array location and an 8-tuple in FIG. 3B applies. The 230 bytes in A (4,6,4) marked "k", $k = 1,2,\ldots,9,a,b$, are mapped independent of the encoder state Z into the 230 binary 9-tuples in L(4,6,4) marked "■" where the images of $A_k$, $k = 1,2,\ldots,b$, are $D_k$, $k = 1,2,\ldots,b$. The remaining 26 bytes in A(4,6,4) marked "c" and "d" are mapped either into the 26 codewords in L (4,6,4) marked "1" if $Z = 1$ or into 26 codewords chosen out of the 35 binary 9-tuples in L(4,6,4) marked "0".

Figure 5C:
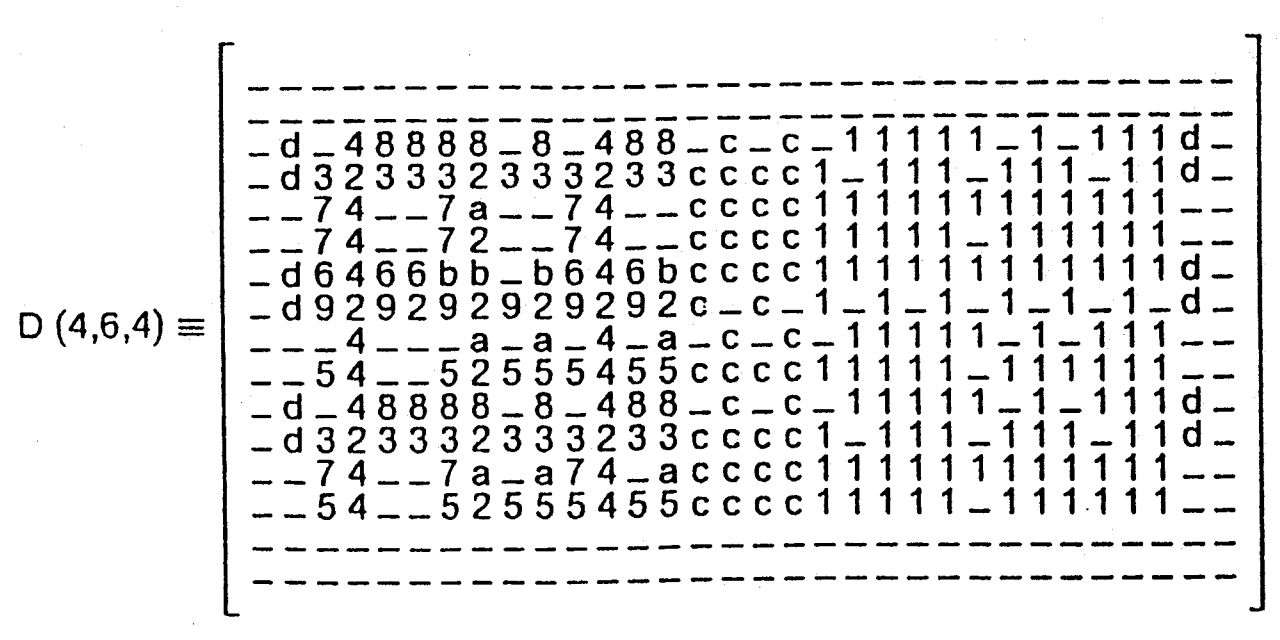

The elements of $D_k$, $k = 1,2,\ldots,b$, are illustrated as locations marked "k" within the $16\times 32$ array shown in FIG. 5C, where the definition with respect to the correspondence between an array location and a 9-tuple in FIG. 3C applies. The images of the 26 bytes in $A_k$, $k = c,d$, depend on the encoder state Z and are specified by the locations marked "c" and "d" in the above array. The pattern of _'s in D (4,6,4) represent all 9-tuples which are not used as codewords and comprises the pattern of —'s in L(4,6,4) in addition to $35-26=9$ unused 9-tuples marked by "0" in L (4,6,4).

Figure 6A:
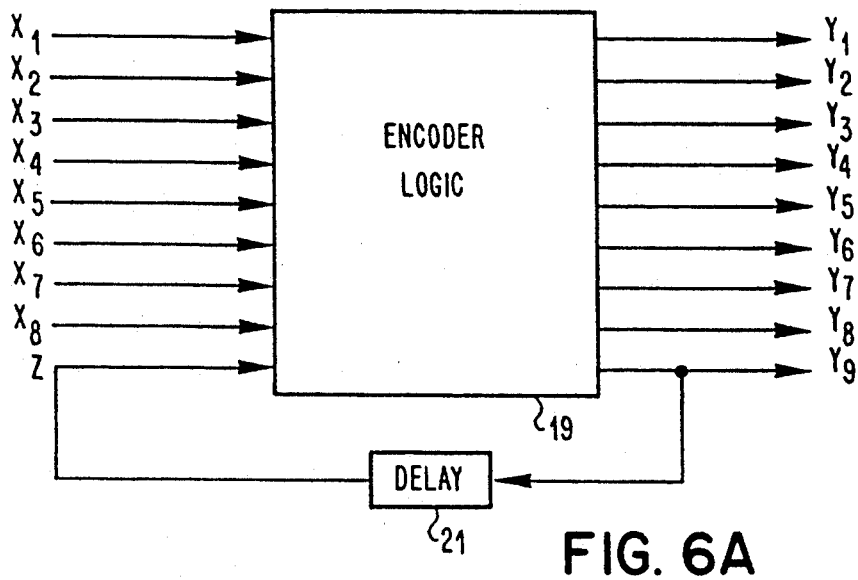
FIGS. 6A and 6B are block diagrams of a finite-state encoder and of a decoder for the implementation of the invention which is represented by the selection and assignment matrices of FIGS. 5A, 5B and 5C.
Figure 6B:
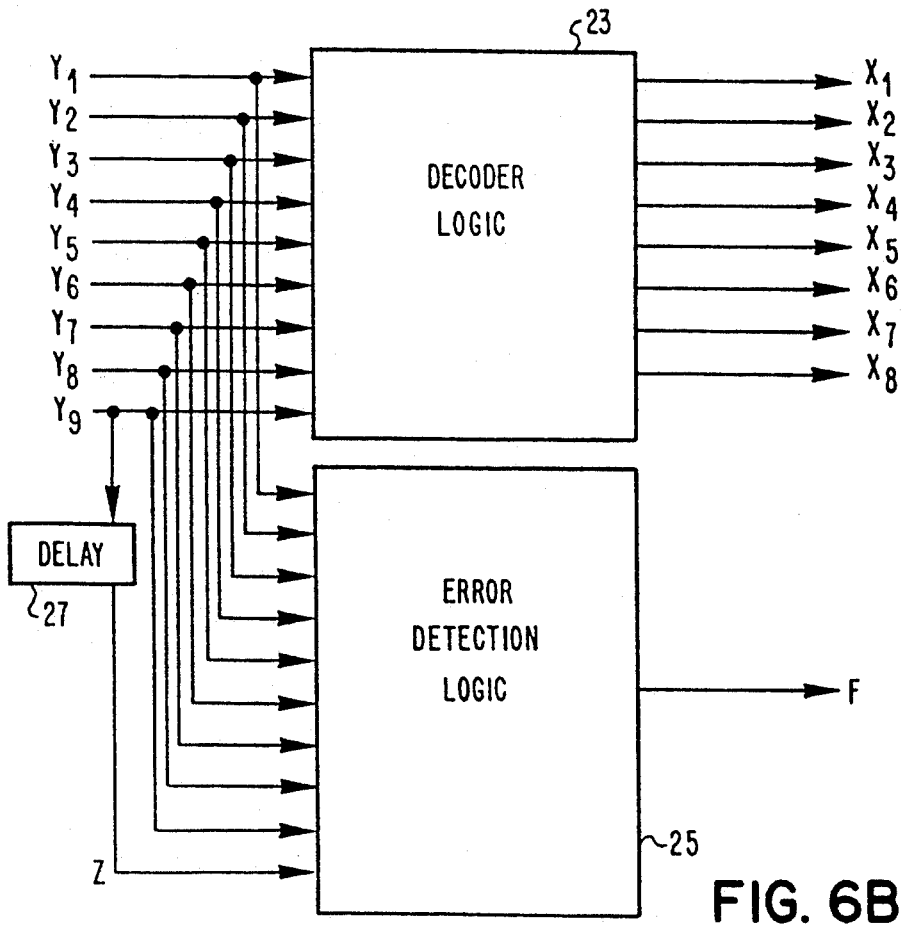

The (4,6,4) encoder/decoder structure is shown in FIG. 6 (6A and 6B). The encoder logic 19 has, besides the eight inputs for bits $X_1, X_2, \ldots, X_8$ and the nine outputs for bits $Y_1, Y_2, \ldots, Y_9$, one extra input Z which is connected through a delay element 21 to the bit output $Y_9$. The delay element represents a time delay corresponding to the period of the byte clock. Thus, an input bit block X may be converted to two different output codewords Y, depending on the last bit of the previous output codewood.

The decoder need not to be a finite-state machine (sequential decoder). A normal block decoder 23 is sufficient which directly converts a codeword Y into an 8-bit block X. For the error detection logic 25, however, an extra input Z is required, receiving the last bit $Y_9$ of the previous codeword through a delay element 27.

The encoder and decoder logic is shown in Tables 5 and 6, respectively. Logic gate arrays implementing these logic equations are contained in the encoder logic 19, the decoder logic 23, and the error detection logic 25, respectively, of FIGS. 6A and 6B. Intermediate variables $V_i$, $i=1,2,\ldots,22$, for the encoder and $W_i$, $i=1,2,\ldots,17$, for the decoder were used to reduce the number of logic gates. An optional error flag F, which is raised when the decoder input is an illegal codeword, is provided.

TABLE 1

(4,6,5) Encoder Logic.

| VARIABLES | PARTITIONS | SUPERPARTITIONS |
|---|---|---|
| $V_1 = X_1 + X_2 + X_3$ | $P_1 = V_1 \cdot V_2 \cdot V_3 \cdot V_4 \cdot V_5 \cdot V_6$ | $S_1 = P_5 + P_6 = \overline{V}_1$ |
| $V_2 = \overline{X_1 \cdot X_2 \cdot X_3}$ | $P_2 = \overline{P}_1 \cdot X_3 \cdot X_4 \cdot (\overline{X}_1 + \overline{X}_2)$ | $S_2 = P_5 + P_7$ |
| $V_3 = X_6 + X_7 + X_8$ | $P_3 = \overline{P}_1 \cdot \overline{X}_2 \cdot \overline{X}_4 \cdot (X_1 + X_3)$ | $S_3 = P_1 + S_2$ |
| $V_4 = \overline{X_5 \cdot X_6 \cdot X_7 \cdot X_8}$ | $P_4 = \overline{P}_1 \cdot \overline{P}_2 \cdot \overline{P}_3 \cdot V_1 \cdot V_2$ | $S_4 = P_2 + P_8 + S_3$ |
| $V_5 = X_2 + X_4 + X_5 + X_7$ | $P_5 = \overline{V}_1 \cdot V_7$ | $S_5 = P_6 + P_8 + P_9$ |
| $V_6 = \overline{X_3 \cdot X_4 \cdot X_5 \cdot X_6 \cdot (X_2 + X_7)}$ | $P_6 = \overline{V}_1 \cdot \overline{V}_7$ | $S_6 = P_1 + P_2$ |
| $V_7 = (X_6 + X_8) \cdot V_4$ | $P_7 = \overline{V}_2 \cdot V_3 \cdot \overline{X}_5$ | $S_7 = P_2 + P_3$ |
|  | $P_8 = \overline{V}_2 \cdot V_4 \cdot V_5$ | $S_8 = P_4 + P_9$ |
|  | $P_9 = \overline{V}_2 \cdot \overline{(P_7 + P_8)}$ | $S_9 = P_7 + S_1$ |

ENCODER OUTPUT
$Y_1 = P_3 \cdot \overline{X}_1 + P_4 \cdot X_8 + P_9 + S_1 + S_6 \cdot X_1$
$Y_2 = P_3 \cdot X_3 + P_4 \cdot X_5 \cdot \overline{X}_6 + P_8 + S_8 \cdot X_2 + S_9 \cdot X_4$
$Y_3 = P_1 \cdot X_3 + P_7 + S_7 + S_8$
$Y_4 = P_1 \cdot X_4 + P_8 \cdot X_4 + S_2 + S_8$
$Y_5 = P_1$
$Y_6 = P_3 + P_4 + P_6 + P_8 \cdot X_6 + \underline{S_3} \cdot X_5$
$Y_7 = P_2 \cdot X_8 + \underline{P}_3 \cdot (X_5 + X_6 + X_8) + P_4 \cdot \overline{X}_4 + S_3 \cdot X_6 + S_5 \cdot X_5$
$Y_8 = P_4 \cdot (X_1 \cdot X_3 + X_2) + P_6 \cdot X_7 \cdot \overline{X}_8 + P_9 \cdot X_4 + S_4 \cdot X_7 + S_7 \cdot \overline{X}_8$
$Y_9 = P_2 \cdot \overline{X}_5 + P_3 \cdot X_8 + P_4 \cdot X_1 + P_6 \cdot \overline{X_5 \cdot X_7} + P_9 + S_4 \cdot X_8$

TABLE 2

(4,6,5) Decoder Logic.

| VARIABLES | PARTITIONS | SUPERPARTITIONS |
|---|---|---|
| $W_1 = Y_4 \cdot \underline{Y}_5$ | $Q_1 = Y_5$ | $T_1 = Q_1 + Q_2$ |
| $W_2 = Y_4 \cdot \overline{Y}_5$ | $Q_2 = W_1 \cdot W_5$ | $T_2 = Q_7 + Q_8 + Q_9$ |
| $W_3 = Y_3 \cdot \underline{Y}_6$ | $Q_3 = W_1 \cdot W_3$ | $T_3 = Q_1 + Q_5 + Q_7$ |
| $W_4 = Y_1 \cdot \underline{Y}_3$ | $Q_4 = W_2 \cdot W_3$ | $T_4 = Q_9 + T_3$ |
| $W_5 = \underline{Y}_3 \cdot \underline{Y}_6$ | $Q_5 = W_2 \cdot W_4$ | $T_5 = Q_6 + Q_8 + Q_9$ |
| $W_6 = Y_1 \cdot Y_5$ | $Q_6 = W_1 \cdot W_4$ | $T_6 = Q_5 + Q_6 + Q_7$ |
| $W_7 = \overline{Y_8 + Y_9}$ | $Q_7 = W_6 \cdot W_5 \cdot Y_4$ | |
| $W_8 = Y_7 \cdot Y_8$ | $Q_8 = W_6 \cdot \overline{Y}_3$ | |
| $W_9 = Y_7 \cdot Y_9$ | $Q_9 = W_2 \cdot W_5 \cdot Y_1$ | |

DECODER OUTPUT
$X_1 = Q_3 \cdot \overline{Y}_1 + Q_4 \cdot Y_9 + T_1 \cdot Y_1 + T_2$ $X_2 = Q_4 \cdot \overline{Y_8 \cdot Y_9} + T_1 \cdot Y_2 + T_2$ $X_3 = Q_1 \cdot Y_3 + Q_2 + Q_3 \cdot \overline{Y}_2 + Q_4 \cdot W_7 + T_2$
$X_4 = Q_1 \cdot Y_4 + Q_2 + Q_4 \cdot Y_7 + Q_8 \cdot Y_4 + Q_9 \cdot Y_8 + T_6 \cdot Y_2$
$X_5 = Q_2 \cdot (Y_7 + \overline{Y}_9) + Q_3 \cdot (W_8 + W_9) + Q_4 \cdot (Y_1 + Y_2) + T_3 \cdot Y_6 + T_5 \cdot Y_7$
$X_6 = (Q_2 + T_3) \cdot Y_7 + Q_3 \cdot Y_8 + Q_4 \cdot Y_1 + Q_6 \cdot W_7 + Q_8 \cdot Y_8 + Q_9 \cdot Y_7$
$X_7 = Q_2 \cdot W_8 + Q_3 \cdot W_9 + Q_4 \cdot Y_1 + Q_6 \cdot (Y_8 + W_7) + Q_9 \cdot Y_7 + T_4 \cdot Y_8$
$X_8 = Q_2 \cdot W_9 + (Q_3 + T_4) \cdot Y_9 + Q_4 \cdot Y_1 + Q_6 \cdot W_7 + Q_9 \cdot Y_7$
ERROR DETECTION FLAG

TABLE 2-continued

(4,6,5) Decoder Logic.

$\overline{R} = (Y_1 + Y_2 + Y_3) \cdot \overline{Y_1 \cdot Y_2 \cdot Y_3} \cdot (Y_7 + Y_8 + Y_9) \cdot \overline{Y_6 \cdot Y_7 \cdot Y_8 \cdot Y_9} \cdot (Y_2 + Y_4 + Y_6 + Y_8) \cdot$ $\{Y_5 \cdot \overline{Y_3 \cdot Y_4 \cdot Y_6 \cdot Y_7 \cdot (Y_2 + Y_8)} + \overline{Y}_5 \cdot (Y_1 + Y_3 + Y_7) \cdot (Y_9 + Y_7 + Y_3) \cdot (\overline{Y}_1 + Y_3 + Y_4 + Y_6) \cdot$ $(\overline{Y}_1 + \overline{Y}_3 + \overline{Y}_4 + Y_6 + Y_9) \cdot (Y_4 + Y_6 + Y_7 + Y_8)\}$

TABLE 3

(4,4,9) Encoder Logic.

VARIABLES

$V_1 = X_1 \cdot X_2 \cdot X_3 \cdot X_4 \cdot X_5$
$V_2 = X_5 \cdot X_6 \cdot X_7 \cdot X_8$
$V_3 = \underline{X}_4 \cdot V_2$
$V_4 = \overline{X}_4 \cdot V_2$
$V_5 = X_1 + X_3$
$V_6 = X_5 + X_8$

PARTITIONS

$M = (X_2 + V_5) \cdot (X_7 + V_5) \cdot (X_4 + X_5 + X_2 \cdot X_7) \cdot \overline{V}_1 \cdot \overline{V}_3 \cdot \overline{V}_4$
$H = \overline{X}_2 \cdot V_5 \cdot V_4$ $T_1 = V_1 \cdot V_6$
$M_1 = \underline{M} + V_5 \cdot X_4 \cdot \overline{T}_1$
$N_1 = \underline{M} \cdot \underline{V}_5 \cdot \underline{X}_4 \cdot H$
$R_1 = \underline{M} \cdot \underline{V}_5 \cdot \underline{X}_2$
$S_1 = M \cdot V_5 \cdot X_2$ $T_2 = V_3 \cdot V_5$
$M_2 = \underline{M} + V_6 \cdot X_5 \cdot \overline{T}_2 \cdot \overline{H}$
$N_2 = \underline{M} \cdot \underline{V}_6 \cdot \underline{X}_5$
$R_2 = \underline{M} \cdot \underline{V}_6 \cdot \underline{X}_7$
$S_2 = M \cdot V_6 \cdot X_7$

ENCODER OUTPUT

$Y_1 = M_1 \cdot X_1 + N_1 \cdot X_1 + R_1 + S_1 \cdot X_4 + T_1 + H$
$Y_2 = M_1 \cdot X_2 + R_1 + S_1 + T_1 + H$
$Y_3 = M_1 \cdot X_3 + N_1 \cdot \underline{X}_3 + R_1 + S_1 \cdot \overline{X}_4 + T_1 + H$
$Y_4 = M_1 \cdot X_4 + N_1 \cdot \overline{X}_2 + R_1 \cdot \overline{X}_4 + S_1 \cdot (\overline{X}_5 + S_2) + H$
$Y_5 = M$
$Y_6 = M_2 \cdot X_5 + N_2 \cdot \overline{X}_7 + R_2 \cdot \overline{X}_5 + S_2 \cdot (\overline{X}_4 + S_1)$
$Y_7 = M_2 \cdot X_6 + N_2 \cdot X_6 + R_2 + S_2 \cdot \overline{X}_5 + T_2 + H \cdot X_3$
$Y_8 = M_2 \cdot X_7 + R_2 + S_2 + T_2$
$Y_9 = M_2 \cdot X_8 + N_2 \cdot X_8 + R_2 + S_2 \cdot X_5 + T_2 + H \cdot X_1$

TABLE 4

(4,4,9) Decoder Logic.

VARIABLES

$W_1 = Y_1 \cdot Y_2 \cdot Y_3$
$W_2 = W_1 \cdot Y_4$
$W_3 = Y_7 \cdot Y_8 \cdot Y_9$
$W_4 = W_3 \cdot Y_6$

PARTITIONS

$M_1 = \underline{Y}_5 + \underline{W}_5$
$N_1 = \underline{M}_1 \cdot \underline{Y}_2$
$R_1 = \underline{M}_1 \cdot W_1 \cdot W_7$
$T_1 = \overline{M}_1 \cdot W_1 \cdot \overline{Y}_4 \cdot \overline{R}_1$ $M_2 = \underline{Y}_5 + \underline{W}_6$
$N_2 = \underline{M}_2 \cdot \overline{Y}_8$
$R_2 = \underline{M}_2 \cdot W_3 \cdot W_8$
$T_2 = \overline{M}_2 \cdot W_3 \cdot \overline{R}_2$ $W_5 = Y_4 \cdot Y_8 \cdot \overline{Y}_6$ $S_1 = \overline{M}_1 \cdot Y_2 \cdot \overline{Y_1 \cdot Y_3}$ $S_2 = \overline{M}_2 \cdot Y_8 \cdot \overline{Y_7 \cdot Y_9}$ $W_6 = Y_6 \cdot Y_2 \cdot \overline{Y}_4 + W_4 \cdot (\overline{Y}_2 \cdot Y_4 + W_2)$ $H = \overline{M}_1 \cdot W_2 \cdot \overline{Y}_6$ $W_7 = Y_4 \cdot Y_6 + W_4 + \overline{Y}_6 \cdot Y_8 \cdot \overline{Y_7 \cdot Y_9}$ $W_8 = Y_6 + W_2 + \overline{Y}_4 \cdot Y_2 \cdot \overline{Y_1 \cdot Y_3}$

DECODER OUTPUT

$X_1 = M_1 \cdot Y_1 + N_1 \cdot \underline{Y}_1 + T_1 + H \cdot Y_9$
$X_2 = M_1 \cdot Y_2 + N_1 \cdot \overline{Y}_4 + R_1 + T_1$
$X_3 = M_1 \cdot Y_3 + N_1 \cdot \underline{Y}_3 + T_1 + H \cdot \underline{Y}_7$
$X_4 = M_1 \cdot Y_4 + R_1 \cdot \underline{Y}_4 + T_1 + S_1 \cdot \underline{Y}_3$
$X_5 = M_2 \cdot Y_6 + R_2 \cdot Y_6 + T_2 + S_2 \cdot \overline{Y}_7 + H$
$X_6 = M_2 \cdot Y_7 + N_2 \cdot \underline{Y}_7 + T_2 + H$
$X_7 = M_2 \cdot Y_8 + N_2 \cdot Y_6 + R_2 + T_2 + H$
$X_8 = M_2 \cdot Y_9 + N_2 \cdot Y_9 + T_2 + H$

ERROR DETECTION FLAG

$\overline{F} = Y_5 \cdot (Y_1 + Y_2 + Y_3) \cdot (Y_4 + Y_6 + Y_2 \cdot Y_8) \cdot (Y_7 + Y_8 + Y_9) \cdot \overline{W}_4 \cdot \overline{W_2 \cdot Y_6} + \overline{Y}_5 \cdot$ $(Y_1 + Y_3) \cdot (Y_7 + Y_9) \cdot (Y_4 + Y_6 + Y_2 \cdot W_3 + W_1 \cdot Y_8)$

TABLE 5

(4,6,4) Encoder Logic.

| VARIABLES | PARTITIONS | | SUPERPARTITIONS |
|---|---|---|---|
| $V_1 = X_1 + X_2$ | $P_1 = V_7 \cdot V_{11} \cdot V_{14}$ | $P_8 = V_{19} \cdot V_4 \cdot \overline{V}_{20}$ | $S_1 = P_1 + P_2$ |
| $V_2 = V_1 + X_3$ | $P_2 = \underline{V}_{14} \cdot \overline{V}_{11}$ | $P_9 = \underline{V}_{19} \cdot \underline{V}_{20}$ | $S_2 = S_1 + P_3 + P_2$ |
| $V_3 = X_6 + X_7 + X_8$ | $P_3 = \overline{V}_5 \cdot V_{15}$ | $P_{10} = \overline{V}_3 \cdot \overline{V}_1 \cdot V_{17} + V_{18} \cdot \overline{V}_{10} \cdot \overline{X}_8$ | $S_3 = S_1 + P_4 + P_{12}$ |
| $V_4 = \overline{X_1 \cdot X_2 \cdot X_3}$ | $P_4 = V_{16} \cdot V_9$ | $P_{11} = \overline{V}_4 \cdot \overline{V}_3$ | $S_4 = S_3 + P_{13}$ |

TABLE 5-continued

(4,6,4) Encoder Logic.

$V_5 = \overline{X_6 \cdot X_7 \cdot X_8}$   $P_5 = \overline{V}_5 \cdot \overline{V}_{15}$   $P_{12} = V_{13} \cdot (\overline{V}_{17} \cdot V_6 + V_{18} \cdot V_{10})$   $S_5 = P_9 + P_{11}$ $V_6 = X_5 + X_7$   $P_6 = \overline{V}_{17} \cdot \overline{V_6 \cdot V_3}$   $P_{13} = V_{16} \cdot \overline{V}_9$   $S_6 = P_{12} + P_{13}$ $V_7 = V_6 + X_2 + X_4$   $P_7 = \overline{V}_7 \cdot V_{14}$   $S_7 = P_6 + P_7$ $V_8 = \overline{X_3 \cdot X_4}$   $S_8 = P_3 + P_8$ $V_9 = \overline{X_5 \cdot X_6}$ $V_{10} = \overline{X}_7 + V_9$
$V_{11} = (V_8 + V_9) \cdot (\overline{X}_2 + V_8 + \overline{X}_5) \cdot (V_{10} + \overline{X}_4)$
$V_{12} = V_2 \cdot V_4$
$V_{13} = V_3 \cdot V_5$
$V_{14} = V_{12} \cdot V_{13}$
$V_{15} = \underline{V}_8 \cdot V_{12}$
$V_{16} = \overline{V}_4 \cdot V_{13}$
$V_{17} = \underline{V}_2 + X_4$
$V_{18} = \underline{V}_2 \cdot X_4$
$V_{19} = \underline{V}_3 \cdot V_1$
$V_{20} = \overline{X}_2 \cdot (X_3 + \overline{X}_4)$
$V_{21} = X_4 + X_3 \cdot \overline{X}_5$
$V_{22} = X_4 + X_3 \cdot X_5$

ENCODER OUTPUT
$Y_1 = S_2 \cdot X_1 + P_4 \cdot X_4 + P_5 \cdot (X_1 + \overline{X}_3) + P_6 \cdot X_8 + P_7 \cdot \overline{X}_1 + S_5 \cdot X_5 + P_{10} \cdot X_3 + S_6 \cdot \overline{Z}$
$Y_2 = S_2 \cdot X_2 + P_5 \cdot X_2 + P_6 \cdot \overline{X}_6 + P_7 \cdot \overline{X}_3 + S_5 \cdot V_{21} + P_{10} \cdot X_4 + S_6 \cdot \overline{Z}$
$Y_3 = S_2 \cdot X_3 + P_4 + P_5 \cdot \underline{V}_{12} + P_6 \cdot \overline{X}_6 + P_7 + P_9 \cdot V_{22} + P_{10} \cdot \overline{X}_3 + P_{11} \cdot \overline{X}_5 + S_6 \cdot \overline{Z}$
$Y_4 = S_2 \cdot X_4 + P_4 + P_5 \cdot \overline{X}_4 + P_6 \cdot X_5 + P_{10} + P_{11} \cdot V_{22} + P_{12} \cdot X_4 + P_{13} \cdot Z$
$Y_5 = P_1 + P_{12} \cdot Z + P_{13} \cdot \overline{Z}$
$Y_6 = S_3 \cdot X_5 + P_3 + P_5 + P_7 \cdot \overline{X}_6 + P_9 + P_{13} \cdot X_4$
$Y_7 = S_3 \cdot X_6 + S_8 + P_6 \cdot S_5 + P_{13}$
$Y_8 = S_4 \cdot X_7 + P_5 \cdot X_5 + S_5 + S_7 + P_{10} \cdot X_5$
$Y_9 = S_4 \cdot X_8 + S_8 \cdot X_5 + P_5 + P_7 \cdot \overline{X}_8 + P_{10} \cdot \overline{X}_6$

TABLE 6

(4,6,4) Decoder Logic

| VARIABLES | PARTITIONS | SUPERPARTITIONS |
|---|---|---|
| $W_1 = \overline{Y_1 \cdot Y_2 \cdot Y_3}$ | $Q_1 = Y_5 \cdot W_1$ | $T_1 = Q_1 + Q_2$ |
| $W_2 = \overline{Y}_5 \cdot W_1$ | $Q_2 = W_{10} \cdot Y_6 + W_6 \cdot (Y_8 \cdot W_{12} + W_5 \cdot \overline{Y}_8)$ | $T_2 = Q_3 + Q_8$ |
| $W_3 = Y_6 \cdot Y_7$ | $Q_3 = \underline{W}_2 \cdot \underline{Y}_8 \cdot W_3 \cdot \overline{W}_4 \cdot W_{12}$ | $T_3 = T_1 + T_2$ |
| $W_4 = \underline{Y}_3 \cdot Y_4$ | $Q_4 = \overline{Y}_5 \cdot \underline{Y}_2 \cdot \underline{W}_4 \cdot W_3$ | $T_4 = Q_4 + Q_{11} + Q_{13}$ |
| $W_5 = \overline{Y}_2 \cdot Y_3$ | $Q_5 = W_2 \cdot \overline{Y}_7 \cdot \overline{W}_4 \cdot W_{13}$ | $T_5 = T_1 + Q_4 + Q_{12}$ |
| $W_6 = Y_4 \cdot W_3$ | $Q_6 = \overline{Y}_5 \cdot W_8 \cdot (\overline{Y_4 \cdot \overline{Y_2 \cdot Y_3}} + \overline{Y}_1 \cdot W_9)$ | $T_6 = Q_9 + Q_{11}$ |
| $W_7 = Y_7 \cdot \overline{Y}_6$ | $Q_7 = W_2 \cdot \overline{Y}_4 \cdot \overline{Y}_7 \cdot \overline{W}_{13}$ | $T_7 = Q_5 + Q_{10}$ |
| $W_8 = Y_8 \cdot \underline{W}_7$ | $Q_8 = W_2 \cdot \underline{W}_{12} \cdot \overline{Y}_8 \cdot W_7 \cdot \overline{W}_5$ | $T_8 = Q_3 + Q_5$ |
| $W_9 = Y_2 \cdot \overline{Y}_3$ | $Q_9 = \underline{W}_2 \cdot \underline{Y}_4 \cdot \underline{Y}_8 \cdot W_3$ | $T_9 = T_5 + Q_{13}$ |
| $W_{10} = \overline{Y}_1 \cdot Y_2 \cdot W_4$ | $Q_{10} = \overline{Y}_5 \cdot Y_6 \cdot \overline{Y}_7 \cdot (\overline{Y}_3 \cdot Y_4 + W_{10})$ | |
| $W_{11} = Y_2 + Y_3$ | $Q_{11} = \overline{Y}_5 \cdot \underline{W}_8 \cdot (Y_1 \cdot Y_2 \cdot Y_3 + Y_1 \cdot \overline{Y}_3 \cdot Y_4)$ | |
| $W_{12} = W_{11} + Y_1$ | $Q_{12} = \overline{Y}_5 \cdot \overline{W}_1$ | |
| $W_{13} = Y_6 \cdot Y_9$ | $Q_{13} = \overline{Y}_5 \cdot W_{12} + Y_5 \cdot \overline{W}_1$ | |
| $W_{14} = Y_4 + Y_8$ | | |
| $W_{15} = Y_3 \cdot Y_7$ | | |
| $W_{16} = W_{14} \cdot \underline{Y}_8$ | | |
| $W_{17} = W_1 + \overline{Y}_4$ | | |

DECODER OUTPUT
$X_1 = T_3 \cdot Y_1 + T_4 + Q_5 \cdot Y_1 \cdot W_{11} + Q_7 \cdot \overline{Y}_1 + Q_9$
$X_2 = (T_3 + Q_5) \cdot Y_2 + T_4$
$X_3 = T_3 \cdot Y_3 + T_4 + Q_5 \cdot W_{11} + Q_7 \cdot \overline{Y}_2 + Q_9 \cdot \overline{W}_5 + Q_{10} \cdot Y_1$
$X_4 = (T_3 \cdot Q_{12}) \cdot Y_4 + Q_4 \cdot Y_1 + Q_5 \cdot \overline{Y}_4 + Q_9 \cdot W_9 + Q_{10} \cdot Y_2 + Q_{11} \cdot Y_2 \cdot Y_4 + Q_{13} \cdot Y_6$
$X_5 = T_5 \cdot Y_6 + T_2 \cdot Y_9 + T_7 \cdot Y_8 + Q_6 \cdot Y_4 + T_6 \cdot Y_1 + Q_{13}$
$X_6 = T_5 \cdot Y_7 + T_8 + Q_6 \cdot \underline{Y}_3 + Q_7 \cdot \overline{Y}_6 + Q_{10} \cdot \overline{Y}_9 + Q_{13}$
$X_7 = T_9 \cdot Y_8 + T_8 + Q_{10} \cdot \overline{Y}_9$
$X_8 = T_9 \cdot Y_9 + T_8 + Q_6 \cdot Y_1 + Q_7 \cdot \overline{Y}_9$

ERROR DETECTION FLAG $\overline{F} = (Y_7 + Y_8 + Y_9) \cdot \overline{Y_7 \cdot Y_8 \cdot Y_9} \cdot (Y_2 + W_{16}) \cdot (Z + W_{12}) \cdot (\overline{Z} + W_1) \cdot \{Y_5 \cdot W_{17} \cdot \overline{W_{10} \cdot Y_6} \cdot \overline{W_5 \cdot Y_8} \cdot$ $(\overline{W}_4 + \overline{W}_3) \cdot (W_1 + Y_7) + \overline{Y}_5 \cdot (W_{12} + Y_4) \cdot (Y_1 + W_{15}) \cdot (Y_9 + W_{15}) \cdot (W_{12} + Y_7) \cdot (W_{11} + W_{14}) \cdot$ TABLE 6-continued (4,6,4) Decoder Logic $(W_{11} + W_{15}) \cdot (Y_7 + Y_{15}) \cdot (W_1 + W_{15}) \cdot (W_{17} + \overline{W_1 \cdot Y_9})\}$

We claim:

1. Method for encoding binary data being partitioned into blocks each having a first given number of bits, into codewords each having a second given number of bits, said method comprising the steps of:
   receiving the binary data;
   producing sequences of fixed-length codewords;
   said sequences having no more than a first preselected number ($G_0$) of consecutive zeros therein;
   said sequences comprising two subsequences, one consisting only of odd bit positions, and another consisting only of even bit positions, each of said subsequences having no more than a second preselected number of ($I_0$) of consecutive zeros therein; and
   said sequences further having no more than a third preselected number ($G_1$) of consecutive ones therein.

2. A method according to claim 1, for encoding data from which by partitioning 8-bit data blocks were formed, into 9-bit codewords, comprising the steps of:
   selecting from the set of all possible 9-bit words $Y = (Y_1, Y_2, \ldots, Y_9)$ a full subset ($L_1$) of 263 potential codewords satisfying the logic conditions $(Y_1+Y_2+Y_3) \cdot (Y_2+Y_3+Y_4+Y_5+Y_6) \cdot (Y_3+Y_4+Y_5+Y_6+Y_7) \cdot$
   $(Y_4+Y_5+Y_6+Y_7+Y_8) \cdot (Y_7+Y_8+Y_9) = 1$ $(Y_1+Y_3+Y_5+Y_7) \cdot (Y_3+Y_5+Y_7+Y_9) \cdot (Y_2+Y_4+Y_6+Y_8) = 1,$ and $Y_1 \cdot Y_2 \cdot Y_3 + Y_2 \cdot Y_3 \cdot Y_4 \cdot Y_5 \cdot Y_6 \cdot Y_7$
   $+ Y_3 \cdot Y_4 \cdot Y_5 \cdot Y_6 \cdot Y_7 \cdot Y_8 + Y_6 \cdot Y_7 \cdot Y_8 \cdot Y_9 = 0;$ selecting from the full subset of potential codewords, a partial subset of 256 actual codewords;
   assigning to each one of the actual codewords of the partial subset, one of the 256 possible 8-bit data blocks; and
   for encoding, replacing each data block by the assigned codeword;
   such that for the resulting sequence of codewords, said first preselected number ($G_0$) is four, said second preselected number ($I_0$) is six, and said third preselected number ($G_1$) is five.

3. A method according to claim 1, for encoding data from which by partitioning 8-bit data blocks were formed, into 9-bit codewords, comprising the steps of:
   selecting from the set of all possible 9-bit words $Y = (Y_1, Y_2, \ldots, Y_9)$ a full subset ($L_2$) of 263 potential codewords satisfying the logic conditions $(Y_1+Y_2+Y_3) \cdot (Y_2+Y_3+Y_4+Y_5+Y_6) \cdot (Y_3+Y_4+Y_5+Y_6+Y_7) \cdot$
   $(Y_4+Y_5+Y_6+Y_7+Y_8) \cdot (Y_7+Y_8+Y_9) = 1$ $(Y_1+Y_3+Y_5+Y_7) \cdot (Y_3+Y_5+Y_7+Y_9) \cdot (Y_2+Y_4+Y_6+Y_8) = 1,$ and $Y_1 \cdot Y_2 \cdot Y_3 \cdot Y_4 + Y_2 \cdot Y_3 \cdot Y_4 \cdot Y_5 \cdot Y_6 \cdot Y_7$
   $+ Y_3 \cdot Y_4 \cdot Y_5 \cdot Y_6 \cdot Y_7 \cdot Y_8 + Y_7 \cdot Y_8 \cdot Y_9 = 0;$ selecting from the full subset of potential codewords, a partial subset of 256 actual codewords;
   assigning to each one of the actual codewords of the partial subset, one of the 256 possible 8-bit data blocks; and
   for encoding, replacing each data block by the assigned codeword;
   such that for the resulting sequence of codewords, said first preselected number ($G_0$) is four, said second preselected number ($I_0$) is six, and said third preselected number ($G_1$) is five.

4. A method according to claim 1, for encoding data from which by partitioning 8-bit data blocks were formed, into 9-bit codewords, comprising the steps of:
   selecting from the set of all possible 9-bit words $Y = (Y_1, Y_2, \ldots, Y_9)$ a full subset ($L_1$) of 259 potential codewords satisfying the logic conditions $(Y_1+Y_2+Y_3) \cdot (Y_2+Y_3+Y_4+Y_5+Y_6) \cdot (Y_3+Y_4+Y_5+Y_6+Y_7) \cdot$
   $(Y_4+Y_5+Y_6+Y_7+Y_8) \cdot (Y_7+Y_8+Y_9) = 1$ $(Y_1+Y_3+Y_5) \cdot (Y_5+Y_7+Y_9) \cdot (Y_2+Y_4+Y_6) \cdot (Y_4+Y_6+Y_8) = 1,$ and $Y_1 \cdot Y_2 \cdot Y_3 \cdot Y_4 \cdot Y_5 \cdot Y_6 + Y_5 \cdot Y_6 \cdot Y_7 \cdot Y_8 \cdot Y_9 = 0;$ selecting from the full subset of potential codewords, a partial subset of 256 actual codewords;
   assigning to each one of the actual codewords of the partial subset, one of the 256 possible 8-bit data blocks; and
   for encoding, replacing each data block by the assigned codeword;
   such that for the resulting sequence of codewords, said first preselected number ($G_0$) is four, said second preselected number ($I_0$) is four, and said third preselected number ($G_1$) is nine.

5. A method according to claim 1, for encoding data from which by partitioning 8-bit data blocks were formed, into 9-bit codewords, comprising the steps of:
   selecting from the set of all possible 9-bit words $Y = (Y_1, Y_2, \ldots, Y_9)$ a full subset ($L_1$) of 259 potential codewords satisfying the logic conditions $(Y_1+Y_2+Y_3) \cdot (Y_2+Y_3+Y_4+Y_5+Y_6) \quad (Y_3+Y_4+Y_5+Y_6+Y_7) \cdot$
   $(Y_4+Y_5+Y_6+Y_7+Y_8) \cdot (Y_7+Y_8+Y_9) = 1$ $(Y_1+Y_3+Y_5) \cdot (Y_5+Y_7+Y_9) \cdot (Y_2+Y_4+Y_6) \cdot (Y_4+Y_6+Y_8) = 1,$ and $Y_1 \cdot Y_2 \cdot Y_3 \cdot Y_4 \cdot Y_5 + Y_4 \cdot Y_5 \cdot Y_6 \cdot Y_7 \cdot Y_8 \cdot Y_9 = 0;$ selecting from the full subset of potential codewords, a partial subset of 256 actual codewords;
   assigning to each one of the actual codewords of the partial subset, one of the 256 possible 8-bit data blocks; and for encoding, replacing each data block by the assigned codeword;

such that for the resulting sequence of codewords, said first preselected number ($G_0$) is four, said second preselected number ($I_0$) is four, and said third preselected number ($G_1$) is nine.

6. A method according to claim 1, for encoding data from which by partitioning a sequence of 8-bit data blocks was formed, into a sequence of 9-bit codewords, comprising the steps of:

selecting from the set of all possible 9-bit words $Y = (Y_1, Y_2, \ldots, Y_9)$ a first full subset (L) of 230 actual codewords satisfying the logic conditions $(Y_1+Y_2+Y_3) \cdot (Y_2+Y_3+Y_4+Y_5+Y_6) \cdot (Y_3+Y_4+Y_5+Y_6+Y_7) \cdot$
$(Y_4+Y_5+Y_6+Y_7+Y_8) \cdot (Y_7+Y_8+Y_9) = 1$ $(Y_1+Y_3+Y_5+Y_7) \cdot (Y_3+Y_5+Y_7+Y_9) \cdot (Y_2+Y_4+Y_6+Y_8) = 1,$ and $Y_1 \cdot Y_2 \cdot Y_3 + Y_2 \cdot Y_3 \cdot Y_4 \cdot Y_5 \cdot Y_6 + Y_3 \cdot Y_4 \cdot Y_5 \cdot Y_6 \cdot Y_7$
$+ Y_4 \cdot Y_5 \cdot Y_6 \cdot Y_7 \cdot Y_8 + Y_7 \cdot Y_8 \cdot Y_9 = 0;$ a second subset (1) of 26 actual first conditional codewords with $Y_1 = Y_2 = Y_3 = 0$, satisfying the logic conditions $(Y_4+Y_5) \cdot (Y_4+Y_5+Y_6) \cdot (Y_4+Y_5+Y_6+Y_7) \cdot$
$(Y_4+Y_5+Y_6+Y_7+Y_8) \cdot (Y_7+Y_8+Y_9) = 1,$ $(Y_5+Y_7) \cdot (Y_5+Y_7+Y_9) \cdot (Y_4+Y_6+Y_8) = 1,$ and $Y_4 \cdot Y_5 \cdot Y_6 \cdot Y_7 \cdot Y_8 + Y_7 \cdot Y_8 \cdot Y_9 = 0;$ a third subset (0) of 35 potential second conditional codewords with $Y_1 = Y_2 = Y_3 = 1$, satisfying the logic conditions $(Y_4+Y_5+Y_6+Y_7+Y_8) \cdot (Y_7+Y_8+Y_9) = 1$ and $Y_4 \cdot Y_5 + Y_4 \cdot Y_5 \cdot Y_6 + Y_4 \cdot Y_5 \cdot Y_6 \cdot Y_7$
$+ Y_4 \cdot Y_5 \cdot Y_6 \cdot Y_7 \cdot Y_8 + Y_7 \cdot Y_8 \cdot Y_9 = 0;$ selecting from the third subset of potential second conditional codewords, a partial subset of 26 actual second conditional codewords;

assigning to each one of the actual codewords of the subsets, one of the 256 possible 8-bit data blocks, with 26 of said possible 8-bit data blocks each being assigned to one first conditional codeword and to one second conditional codeword; and for encoding, replacing each data block by the assigned codeword, the selection of the conditional codewords depending on the binary value of the last bit of the previously generated codeword;

such that for the resulting sequence of codewords, said first preselected number ($G_0$) is four, said second preselected number ($I_0$) is six, and said third preselected number ($G_1$) is four.

7. Apparatus for encoding binary data into codewords, said apparatus comprising:

receiver means for receiving the binary data and for partitioning them into blocks each comprising a first given number of bits;

encoder means, coupled to the receiver means, for producing sequences of fixed-length codewords each comprising a second given number of bits;

said sequences having no more than a first preselected number ($G_0$) of consecutive zeros therein;

said sequences comprising two subsequences, one consisting only of odd bit positions, and another consisting only of even bit positions, each of said subsequences having no more than a second preselected number ($I_0$) of consecutive zeros therein; and said sequences further having no more than a third preselected number ($G_1$) of consecutive ones therein, said third preselected number ($G_1$) being less than or equal to ten.

8. Apparatus according to claim 7, comprising an encoder for converting 8-bit input data blocks $X = (X_1, X_2, \ldots, X_8)$ into 9-bit output codewords $Y = (Y_1, Y_2, \ldots, Y_9)$, said encoder having logic gates for implementing the logic relations $Y_1 = P_3 \cdot \overline{X}_1 + P_4 \cdot X_8 + P_9 + S_1 + S_6 \cdot X_1$
$Y_2 = P_3 \cdot X_3 + P_4 \cdot X_5 \cdot \overline{X}_6 + P_8 + S_6 \cdot X_2 + S_9 \cdot X_4$
$Y_3 = P_1 \cdot X_3 + P_7 + S_7 + S_8$
$Y_4 = P_1 \cdot X_4 + P_8 \cdot X_4 + S_2 + S_8$
$Y_5 = P_1$
$Y_6 = P_3 + P_4 + P_6 + P_8 \cdot X_6 + S_3 \cdot X_5$
$Y_7 = P_2 \cdot \underline{X}_6 + \underline{P}_3 \cdot (\underline{X}_5 + X_6 \cdot \overline{X}_8) + \underline{P}_4 \cdot \overline{X}_4 + S_3 \cdot X_6 + S_5 \cdot X_5$
$Y_8 = P_4 \cdot (\overline{X}_1 \cdot \overline{X}_3 + \overline{X}_2) + P_6 \cdot X_7 \cdot \overline{X}_8 + P_9 \cdot X_4 + S_4 \cdot X_7 + S_7 \cdot \overline{X}_6$ $Y_9 = P_2 \cdot \overline{X}_5 + P_3 \cdot X_8 + P_4 \cdot X_1 + P_6 \cdot \overline{X_5 \cdot X_7} + P_9 + S_4 \cdot X_8$ with

| | | |
|---|---|---|
| $V_1 = X_1 + X_2 + X_3$ | $P_1 = V_1 \cdot V_2 \cdot V_3 \cdot V_4 \cdot V_5 \cdot V_6$ | $S_1 = P_5 + P_8 = \overline{V}_1$ |
| $V_2 = \overline{X_1 \cdot X_2 \cdot X_3}$ | $P_2 = \overline{P}_1 \cdot X_3 \cdot X_4 \cdot (\overline{X}_1 + \overline{X}_2)$ | $S_2 = P_5 + P_7$ |
| $V_3 = X_6 + X_7 + X_8$ | $P_3 = \overline{P}_1 \cdot \overline{X}_2 \cdot \overline{X}_4 \cdot (X_1 + X_3)$ | $S_3 = P_1 + S_2$ |
| $V_4 = \overline{X_5 \cdot X_6 \cdot X_7 \cdot X_8}$ | $P_4 = \overline{P}_1 \cdot \overline{P}_2 \cdot \overline{P}_3 \cdot V_1 \cdot V_2$ | $S_4 = P_2 + P_8 + S_3$ |
| $V_5 = X_2 + X_4 + X_5 + X_7$ | $P_5 = \overline{V}_1 \cdot V_7$ | $S_5 = P_6 + P_8 + P_9$ |
| $V_6 = \overline{X_3 \cdot X_4 \cdot X_5 \cdot X_6 \cdot (X_2 + X_7)}$ | $P_6 = \overline{V}_1 \cdot \overline{V}_7$ | $S_6 = P_1 + P_2$ |

-continued

| | | |
|---|---|---|
| $V_7 = (X_6 + X_8) \cdot V_4$ | $P_7 = \overline{V}_2 \cdot V_3 \cdot \overline{X}_5$ | $S_7 = P_2 + P_3$ |
| | $P_8 = \overline{V}_2 \cdot V_4 \cdot X_5$ | $S_8 = P_4 + P_9$ |
| | $P_9 = \overline{V}_2 \cdot \overline{(P_7 + P_8)}$ | $S_9 = P_7 + S_1$ | such that in response to an arbitrary sequence of input data blocks, for the resulting sequence of output codewords said first preselected number ($G_0$) is four, said second preselected number ($I_0$) is six, and said third preselected number ($G_1$) is five.

9. Apparatus according to claim 7, comprising an encoder for converting 8-bit input data blocks $X=(X_1, X_2, \ldots, X_8)$ into 9-bit output codewords $Y=(Y_1, Y_2, \ldots, Y_9)$, said encoder having logic gates for implementing the logic relations second preselected number ($I_0$) is four, and said third preselected number ($G_1$) is nine.

10. Apparatus according to claim 7, comprising an encoder for converting a sequence of 8-bit input data blocks $X=(X_1, X_2, \ldots, X_8)$ into 9-bit output codewords $Y=(Y_1, Y_2, \ldots, Y_9)$;

said encoder being a sequential encoder (FIG. 6A) having nine outputs for furnishing the nine bits of each output codeword; and having nine inputs, eight of them being connected to receive the eight $$Y_1 = M_1 \cdot X_1 + N_1 \cdot X_1 + R_1 + S_1 \cdot X_4 + T_1 + H$$
$$Y_2 = M_1 \cdot X_2 + R_1 + S_1 + T_1 + H$$
$$Y_3 = M_1 \cdot X_3 + N_1 \cdot \overline{X}_3 + R_1 + S_1 \cdot \overline{X}_4 + T_1 + H$$
$$Y_4 = M_1 \cdot X_4 + N_1 \cdot X_2 + R_1 \cdot \overline{X}_4 + S_1 \cdot (\overline{X}_5 + S_2) + H$$
$$Y_5 = M$$
$$Y_6 = M_2 \cdot X_5 + N_2 \cdot \overline{X}_7 + R_2 \cdot \overline{X}_5 + S_2 \cdot (\overline{X}_4 + S_1)$$
$$Y_7 = M_2 \cdot X_6 + N_2 \cdot X_6 + R_2 + S_2 \cdot \overline{X}_5 + T_2 + H \cdot X_3$$
$$Y_8 = M_2 \cdot X_7 + R_2 + S_2 + T_2$$
$$Y_9 = M_2 \cdot X_8 + N_2 \cdot X_8 + R_2 + S_2 \cdot X_5 + T_2 + H \cdot X_1$$
with
$$V_1 = X_1 \cdot X_2 \cdot X_3 \cdot X_4 \cdot X_5 \qquad M = (X_2 + V_5) \cdot (X_7 + V_6) \cdot (X_4 + X_5 + X_2 \cdot X_7) \cdot \overline{V}_1 \cdot \overline{V}_3 \cdot \overline{V}_4$$
$$V_2 = X_5 \cdot X_6 \cdot X_7 \cdot X_8 \qquad H = X_2 \cdot V_5 \cdot V_4$$
$$V_3 = \overline{X}_4 \cdot V_2 \qquad T_1 = V_1 \cdot V_6 \qquad T_2 = V_3 \cdot V_5$$
$$V_4 = \overline{X}_4 \cdot V_2 \qquad M_1 = \underline{M} + V_5 \cdot X_4 \cdot \overline{T}_1 \qquad M_2 = \underline{M} + V_6 \cdot X_5 \cdot \overline{T}_2 \cdot \overline{H}$$
$$V_5 = X_1 + X_3 \qquad N_1 = \underline{M} \cdot \underline{V}_5 \cdot \overline{X}_4 \cdot H \qquad N_2 = \underline{M} \cdot \underline{V}_6 \cdot \overline{X}_5$$
$$V_6 = X_6 + V_8 \qquad R_1 = \underline{M} \cdot \underline{V}_5 \cdot \underline{X}_2 \qquad R_2 = \underline{M} \cdot \underline{V}_8 \cdot \underline{X}_7$$
$$\qquad S_1 = \underline{M} \cdot \underline{V}_5 \cdot \underline{X}_2 \qquad S_2 = \underline{M} \cdot \underline{V}_6 \cdot \underline{X}_7$$

such that in response to an arbitrary sequence of input data blocks, for the resulting sequence of output codewords said first preselected number ($G_0$) is four, said bits of an input data block, and the ninth input (Z) being connected to the ninth output through a delay element (21);

said encoder comprising logic gates which implement the following logic relations $$Y_1 = S_2 \cdot X_1 + P_4 \cdot X_4 + P_5 \cdot (X_1 + \overline{X}_3) + P_6 \cdot X_8 + P_7 \cdot \overline{X}_1 + S_5 \cdot X_5 + P_{10} \cdot X_3 + S_6 \cdot \overline{Z}$$
$$Y_2 = S_2 \cdot X_2 + P_5 \cdot X_2 + P_8 \cdot \overline{X}_6 + P_7 \cdot \overline{X}_3 + S_5 \cdot V_{21} + P_{10} \cdot X_4 + S_6 \cdot \overline{Z}$$
$$Y_3 = S_2 \cdot X_3 + P_4 + P_5 \cdot \underline{V}_{12} + P_6 \cdot X_6 + P_7 + P_9 \cdot \overline{V}_{22} + P_{10} \cdot X_3 + P_{11} \cdot \overline{X}_5 + S_6 \cdot \overline{Z}$$
$$Y_4 = S_2 \cdot X_4 + P_4 + P_5 \cdot \underline{X}_4 + P_6 \cdot X_5 + P_{10} + P_{11} \cdot V_{22} + P_{12} \cdot X_4 + P_{13} \cdot Z$$
$$Y_5 = P_1 + P_{12} \cdot Z + P_{13} \cdot Z$$
$$Y_6 = S_3 \cdot X_5 + P_3 + P_5 + P_7 \cdot \overline{X}_8 + P_9 + P_{13} \cdot X_4$$
$$Y_7 = S_3 \cdot X_6 + S_8 + P_6 + S_5 + P_{13}$$
$$Y_8 = S_4 \cdot X_7 + P_5 \cdot X_5 + S_5 + S_7 + P_{10} \cdot X_5$$
$$Y_9 = S_4 \cdot X_8 + S_8 \cdot X_5 + P_5 + P_7 \cdot \overline{X}_8 + P_{10} \cdot \overline{X}_8$$
with

| | | |
|---|---|---|
| $V_1 = X_1 + X_2$ | $V_9 = \overline{X_5 \cdot X_6}$ | $V_{17} = V_2 + X_4$ |
| $V_2 = V_1 + X_3$ | $V_{10} = \overline{X}_7 + V_9$ | $V_{18} = \overline{V}_2 \cdot X_4$ |
| $V_3 = X_6 + X_7 + X_8$ | $V_{11} = (V_8 + V_9) \cdot (\overline{X}_2 + V_8 + \overline{X}_5) \cdot (V_{10} + \overline{X}_4)$ | $V_{19} = \overline{V}_3 \cdot V_1$ |
| $V_4 = \overline{X_1 \cdot X_2 \cdot X_3}$ | $V_{12} = V_2 \cdot V_4$ | $V_{20} = \overline{X}_2 \cdot (X_3 + \overline{X}_4)$ |
| $V_5 = \overline{X_6 \cdot X_7 \cdot X_8}$ | $V_{13} = V_3 \cdot V_5$ | $V_{21} = X_4 + X_3 \cdot \overline{X}_5$ |
| $V_6 = X_5 + X_7$ | $V_{14} = V_{12} \cdot V_{13}$ | $V_{22} = X_4 + X_3 \cdot X_5$ |
| $V_7 = V_6 + X_2 + X_4$ | $V_{15} = V_8 \cdot V_{12}$ | |
| $V_8 = \overline{X_3 \cdot X_4}$ | $V_{16} = \overline{V}_4 \cdot V_{13}$ | | and

| | | |
|---|---|---|
| $P_1 = V_7 \cdot \underline{V}_{11} \cdot V_{14}$ | $P_8 = V_{19} \cdot V_4 \cdot \overline{V}_{20}$ | $S_1 = P_1 + P_2$ |
| $P_2 = \underline{V}_{14} \cdot \overline{V}_{11}$ | $P_9 = \underline{V}_{19} \cdot \underline{V}_{20}$ | $S_2 = S_1 + P_3 + P_8$ |
| $P_3 = \overline{V}_5 \cdot V_{15}$ | $P_{10} = \overline{V}_3 \cdot \overline{V}_1 \cdot V_{17} + V_{18} \cdot \overline{V}_{10} \cdot \overline{X}_8$ | $S_3 = S_1 + P_4 + P_{12}$ |

-continued

| | | |
|---|---|---|
| $P_4 = \underline{V}_{15} \cdot \underline{V}_9$ | $P_{11} = \overline{V}_4 \cdot \overline{V}_3$ | $S_4 = S_3 + P_{13}$ |
| $P_5 = \overline{V}_5 \cdot \overline{V}_{15}$ | $P_{12} = V_{13} \cdot (\overline{V}_{17} \cdot V_6 + V_{18} \cdot V_{10})$ | $S_5 = P_9 + P_{11}$ |
| $P_6 = \overline{V}_{17} \cdot \overline{V_6 \cdot V_3}$ | $P_{13} = V_{16} \cdot \overline{V}_9$ | $S_6 = P_{12} + P_{13}$ |
| $P_7 = \overline{V}_7 \cdot V_{14}$ | | $S_7 = P_6 + P_7$ |
| | | $S_8 = P_3 + P_8$ | such that in response to an arbitrary sequence of input data blocks, for the resulting sequence of output codewords said first preselected number ($G_0$) is four, said second preselected number ($I_0$) is six, and said third preselected number ($G_1$) is four.

11. Decoder apparatus for converting 9-bit input codewords $Y=(Y_1, Y_2, \ldots, Y_9)$ generated by encoder apparatus according to claim 8, into 8-bit output data blocks $X=(X_1, X_2, \ldots, X_8)$, said decoder apparatus comprising logic gates which implement the following logic relations $X_1 = Q_3 \cdot \overline{Y}_1 + Q_4 \cdot Y_9 + T_1 \cdot Y_1 + T_2$ $X_2 = Q_4 \cdot \overline{Y_8 \cdot Y_9} + T_1 \cdot Y_2 + T_2$ $X_3 = Q_1 \cdot Y_3 + Q_2 + Q_3 \cdot \overline{Y}_2 + Q_4 \cdot W_7 + T_2$
$X_4 = Q_1 \cdot Y_4 + Q_2 + Q_4 \cdot \overline{Y}_7 + Q_8 \cdot Y_4 + Q_9 \cdot Y_8 + T_6 \cdot Y_2$
$X_5 = Q_2 \cdot (Y_7 + \overline{Y}_9) + Q_3 \cdot (W_8 + W_9) + Q_4 \cdot (Y_1 + Y_2) + T_3 \cdot$ $Y_6 + T_5 \cdot Y_7$
$X_6 = (Q_2 + T_3) \cdot Y_7 + Q_3 \cdot \overline{Y}_8 + Q_4 \cdot Y_1 + Q_6 \cdot W_7 + Q_8 \cdot Y_6 + Q_9 \cdot Y_7$
$X_7 = Q_2 \cdot W_8 + Q_3 \cdot W_9 + Q_4 \cdot Y_1 + Q_6 \cdot (Y_8 + W_7) + Q_9 \cdot Y_7 + T_4 \cdot Y_8$
$X_8 = Q_2 \cdot W_9 + (Q_3 + T_4) \cdot Y_9 + Q_4 \cdot Y_1 + Q_6 \cdot W_7 + Q_9 \cdot Y_7$
with -continued

| | | |
|---|---|---|
| $W_1 = \overline{Y}_4 \cdot \overline{Y}_5$ | $Q_1 = Y_5$ | $T_1 = Q_1 + Q_2$ |
| $W_2 = Y_4 \cdot \overline{Y}_5$ | $Q_2 = W_1 \cdot W_5$ | $T_2 = Q_7 + Q_8 + Q_9$ |
| $W_3 = Y_3 \cdot \overline{Y}_6$ | $Q_3 = W_1 \cdot W_3$ | $T_3 = Q_1 + Q_5 + Q_7$ |
| $W_4 = Y_1 \cdot \overline{Y}_3$ | $Q_4 = W_2 \cdot W_3$ | $T_4 = Q_8 + T_3$ |
| $W_5 = \overline{Y}_3 \cdot \overline{Y}_6$ | $Q_5 = W_2 \cdot W_4$ | $T_5 = Q_6 + Q_8 + Q_9$ |
| $W_6 = \overline{Y}_1 \cdot \overline{Y}_5$ | $Q_6 = W_1 \cdot W_4$ | $T_6 = Q_5 + Q_6 + Q_7$ |
| $W_7 = \overline{Y_8 + Y_9}$ | $Q_7 = W_6 \cdot W_5 \cdot Y_4$ | |
| $W_8 = Y_7 \cdot Y_8$ | $Q_8 = W_6 \cdot \overline{Y}_3$ | |
| $W_9 = Y_7 \cdot Y_9$ | $Q_9 = W_2 \cdot W_5 \cdot Y_1$ | |

12. Decoder apparatus for converting 9-bit input codewords $Y=(Y_1, Y_2, \ldots, Y_9)$ generated by encoder apparatus according to claim 9, into 8-bit output data blocks $X=(X_1, X_2, \ldots, X_8)$, said decoder apparatus comprising logic gates which implement the following logic relations $X_1 = M_1 \cdot Y_1 + N_1 \cdot \underline{Y}_1 + T_1 + H \cdot Y_9$
$X_2 = M_1 \cdot Y_2 + N_1 \cdot \overline{Y}_4 + R_1 + T_1$
$X_3 = M_1 \cdot Y_3 + N_1 \cdot \underline{Y}_3 + T_1 + H \cdot \underline{Y}_7$
$X_4 = M_1 \cdot Y_4 + R_1 \cdot \overline{Y}_4 + T_1 + S_1 \cdot \underline{Y}_3$
$X_5 = M_2 \cdot Y_6 + R_2 \cdot \overline{Y}_6 + T_2 + S_2 \cdot \overline{Y}_7 + H$
$X_6 = M_2 \cdot Y_7 + N_2 \cdot \underline{Y}_7 + T_2 + H$
$X_7 = M_2 \cdot Y_8 + N_2 \cdot \overline{Y}_6 + R_2 + T_2 + H$
$X_8 = M_2 \cdot Y_9 + N_2 \cdot Y_9 + T_2 + H$
with $W_1 = Y_1 \cdot Y_2 \cdot Y_3$
$W_2 = W_1 \cdot Y_4$
$W_3 = Y_7 \cdot Y_8 \cdot Y_9$
$W_4 = W_3 \cdot Y_6$ $M_1 = \underline{Y}_5 + \underline{W}_5 \qquad M_2 = \underline{Y}_5 + \underline{W}_6$
$N_1 = \overline{M}_1 \cdot Y_2 \qquad N_2 = \overline{M}_2 \cdot Y_8$
$R_1 = \overline{M}_1 \cdot W_1 \cdot W_7 \qquad R_2 = \overline{M}_2 \cdot W_3 \cdot W_8$
$T_1 = \overline{M}_1 \cdot W_1 \cdot \overline{Y}_4 \cdot \overline{R}_1 \qquad T_2 = \overline{M}_2 \cdot W_3 \cdot \overline{R}_2$ $W_5 = Y_4 \cdot Y_8 \cdot \overline{Y}_6$ $S_1 = \overline{M}_1 \cdot Y_2 \cdot \overline{Y_1 \cdot Y_3} \qquad S_2 = \overline{M}_2 \cdot Y_8 \cdot \overline{Y_7 \cdot Y_9}$ $W_6 = Y_6 \cdot Y_2 \cdot \overline{Y}_4 + W_4 \cdot (\overline{Y}_2 \cdot \overline{Y}_4 + W_2)$ $H = \overline{M}_1 \cdot W_2 \cdot \overline{Y}_6$ $W_7 = Y_4 \cdot Y_6 + W_4 \cdot \overline{Y}_6 \cdot Y_8 \cdot \overline{Y_7 \cdot Y_9}$ $W_8 = Y_6 + W_2 + \overline{Y}_4 \cdot Y_2 \cdot \overline{Y_1 \cdot Y_3}$ 13. Decoder apparatus for converting 9-bit input codewords $Y=(Y_1, Y_2, \ldots, Y_9)$ generated by encoder apparatus according to claim 10, into 8-bit output data blocks $X=(X_1, X_2, \ldots, X_8)$, said decoder apparatus comprising logic gates which implement the following logic relations $X_1 = T_3 \cdot Y_1 + T_4 + Q_5 \cdot Y_1 \cdot W_{11} + Q_7 \cdot \overline{Y}_1 + Q_9$
$X_2 = (T_3 + Q_5) \cdot Y_2 + T_4$
$X_3 = T_3 \cdot Y_3 + T_4 + Q_5 \cdot W_{11} + Q_7 \cdot \overline{Y}_2 + Q_9 \cdot \overline{W}_5 + Q_{10} \cdot Y_1$
$X_4 = (T_3 + Q_{12}) \cdot Y_4 + Q_4 \cdot Y_1 + Q_5 \cdot Y_4 + Q_9 \cdot W_9 + Q_{10} \cdot Y_2 + Q_{11} \cdot Y_2 \cdot Y_4 + Q_{13} \cdot Y_6$
$X_5 = T_5 \cdot Y_6 + T_2 \cdot Y_9 + T_7 \cdot Y_8 + Q_6 \cdot Y_4 + T_6 \cdot Y_1 + Q_{13}$
$X_6 = T_5 \cdot Y_7 + T_8 + Q_6 \cdot \underline{Y}_3 + Q_7 \cdot Y_6 + Q_{10} \cdot Y_9 + Q_{13}$
$X_7 = T_9 \cdot Y_8 + T_8 + Q_{10} \cdot Y_9$
$X_8 = T_9 \cdot Y_9 + T_8 + Q_6 \cdot Y_1 + Q_7 \cdot \overline{Y}_9$
with $W_1 = \overline{Y_1 \cdot Y_2 \cdot Y_3} \qquad Q_1 = Y_5 \cdot W_1 \qquad\qquad T_1 = Q_1 + Q_2$ -continued $W_2 = \overline{Y}_5 \cdot W_1$
$W_3 = Y_6 \cdot Y_7$
$W_4 = \underline{Y}_3 \cdot Y_4$
$W_5 = \overline{Y}_2 \cdot Y_3$ $W_6 = Y_4 \cdot W_3$ $W_7 = Y_7 \cdot \overline{Y}_6$
$W_8 = Y_8 \cdot \underline{W}_7$
$W_9 = Y_2 \cdot \overline{Y}_3$
$W_{10} = \overline{Y}_1 \cdot Y_2 \cdot W_4$
$W_{11} = Y_2 + Y_3$
$W_{12} = W_{11} + Y_1$
$W_{13} = Y_6 \cdot Y_9$
$W_{14} = Y_4 + Y_6$
$W_{15} = Y_3 + Y_7$
$W_{16} = W_{14} + \overline{Y}_8$
$W_{17} = W_1 + \overline{Y}_4$ $Q_2 = W_{10} \cdot \underline{Y}_6 + W_{6} \cdot (Y_8 \cdot W_{12} + W_5 \cdot \overline{Y}_8)$
$Q_3 = \underline{W}_2 \cdot \underline{Y}_8 \cdot W_3 \cdot \underline{W}_4 \cdot W_{12}$
$Q_4 = \overline{Y}_5 \cdot \underline{Y}_2 \cdot \underline{W}_4 \cdot \overline{W}_3$
$Q_5 = W_2 \cdot Y_7 \cdot \overline{W}_4 \cdot W_{13}$ $Q_6 = \overline{Y}_5 \cdot W_8 \cdot (\overline{Y}_4 \cdot \overline{Y_2 \cdot Y_3} + \overline{Y}_1 \cdot W_9)$ $Q_7 = W_2 \cdot \overline{Y}_4 \cdot \underline{Y}_7 \cdot \overline{W}_{13}$
$Q_8 = W_2 \cdot \underline{W}_{12} \cdot \underline{Y}_8 \cdot W_7 \cdot \overline{W}_5$
$Q_9 = W_2 \cdot \underline{Y}_4 \cdot Y_8 \cdot W_3$
$Q_{10} = \overline{Y}_5 \cdot Y_6 \cdot \underline{Y}_7 \cdot (Y_3 \cdot Y_4 + W_{10})$
$Q_{11} = \overline{Y}_5 \cdot \underline{W}_8 \cdot (\overline{Y}_1 \cdot Y_2 \cdot Y_3 + Y_1 \cdot \overline{Y}_3 \cdot Y_4)$
$Q_{12} = \overline{Y}_5 \cdot \overline{W}_1$
$Q_{13} = \overline{Y}_5 \cdot W_{12} + Y_5 \cdot \overline{W}_1$ $T_2 = Q_3 + Q_8$
$T_3 = T_1 + T_2$
$T_4 = Q_4 + Q_{11} + Q_{13}$
$T_5 = T_1 + Q_4 + Q_{12}$ $T_6 = Q_9 + Q_{11}$ $T_7 = Q_5 + Q_{10}$
$T_8 = Q_3 + Q_5$
$T_9 = T_5 + Q_{13}$

\* \* \* \* \*

UNITED STATES PATENT AND TRADEMARK OFFICE
CERTIFICATE OF CORRECTION

PATENT NO. : 5,241,309
DATED : August 31, 1993
INVENTOR(S) : Roy D. Cideciyan, Francois B. Dolivo It is certified that error appears in the above-identified patent and that said Letters Patent is hereby corrected as shown below:

Claim 1, Column 15, Line 24, delete "therein." and insert:

-- therein, wherein said third preselected number is no more than said second given number of bits. --

Signed and Sealed this

Eighth Day of March, 1994

Attest:

BRUCE LEHMAN

Attesting Officer

Commissioner of Patents and Trademarks